United States Patent [19]
Lee et al.

[11] Patent Number: 5,192,703
[45] Date of Patent: Mar. 9, 1993

[54] METHOD OF MAKING TUNGSTEN CONTACT CORE STACK CAPACITOR

[75] Inventors: Roger R. Lee; Fernando Gonzalez, both of Boise, Id.

[73] Assignee: Micron Technology, Inc., Boise, Id.

[21] Appl. No.: 786,242

[22] Filed: Oct. 31, 1991

[51] Int. Cl.⁵ .............................................. H01L 21/70
[52] U.S. Cl. ...................................... 437/52; 437/47; 437/48; 437/60; 437/192; 437/919
[58] Field of Search ...................... 437/47, 48, 52, 60, 437/192, 200, 228, 238, 235, 919; 357/23.6, 51

[56] References Cited

U.S. PATENT DOCUMENTS

| | | | |
|---|---|---|---|
| 4,267,012 | 5/1981 | Pierce et al. | 437/192 |
| 4,970,564 | 11/1990 | Kimura et al. | 357/23.6 |
| 4,974,040 | 11/1991 | Taguchi et al. | |
| 5,005,072 | 4/1991 | Gonzalez | |
| 5,006,481 | 4/1991 | Chan et al. | |
| 5,045,494 | 9/1991 | Choi et al. | 437/193 |

FOREIGN PATENT DOCUMENTS 0267730 5/1988 European Pat. Off. ............ 437/192
0386947 9/1990 European Pat. Off.

OTHER PUBLICATIONS

Ema et al. "3-Dimensional Stacked Capacitor Cell for 16M and 64M Drams", IEDM Dec. 1988, pp. 592-595.

*Primary Examiner*—Tom Thomas
*Attorney, Agent, or Firm*—Susan B. Collier

[57] ABSTRACT

The invention is a product and method for forming the same comprising a storage contact capacitor of a DRAM device wherein the storage node capacitor plate comprises first and second capacitor portions. The first portion is a self-aligned Tungsten and TiN core. In a first embodiment the second portion is a storage node polysilicon deposited and subjected to an insitu phosphorus diffusion doping. In a second embodiment the second portion comprises tungsten fingers formed elevationally and horizontally to overlie the tungsten and TiN core. Portions of TiN provide spacing between adjacent tungsten fingers. An upper polysilicon layer functions as the upper capacitor plate and is insulated from the lower capacitor plate by a dielectric layer.

17 Claims, 22 Drawing Sheets

METHOD OF MAKING TUNGSTEN CONTACT CORE STACK CAPACITOR

FIELD OF THE INVENTION

This invention relates to semiconductor technology and, more particularly, to cell capacitors for use in dynamic random access memories (DRAMs).

BACKGROUND OF THE INVENTION

The memory cells of dynamic random access memories (DRAMs) which are arranged in an array having a configuration of intersecting wordlines and digit lines are comprised of two main components, a field-effect transistor (FET) and a capacitor. In DRAM cells utilizing a conventional planar capacitor, far more chip surface area is dedicated to the planar capacitor than to the field-effect transistor. In a typical construction the wordlines are generally etched from a polysilicon-1 layer. A doped region of silicon substrate functions as the lower capacitor plate (storage node), while a polysilicon-2 layer generally functions as the upper capacitor plate (cell plate).

Although planar capacitors have generally proven adequate for use in DRAM chips up to the 1-megabit level, they are considered to be unusable for more advanced DRAM generations. As component density in memory chips has increased, the shrinkage of cell capacitor size has resulted in a number of problems. Firstly, the alpha-particle component of normal background radiation can generate hole-electron pairs in the silicon substrate, which functions as the lower capacitor plate. This phenomena will cause a charge stored within the affected cell capacitor to rapidly dissipate, resulting in a "soft" error. Secondly, the sense amplifier differential signal is reduced. This aggravates noise sensitivity and makes it more difficult to design a sense amplifier having appropriate signal selectivity. Thirdly, as cell capacitor size is decreased, the cell refresh time must generally be shortened, thus requiring more frequent interruptions for refresh overhead. The difficult goal of a DRAM designer is to increase or, at least, maintain cell capacitance as cell size shrinks, without resorting to processes that reduce product yield or that markedly increase the number of masking and deposition steps in the production process.

Some manufactures of 4-megabit DRAMs are utilizing cell designs based on nonplanar capacitors. Two basic nonplanar capacitor designs are currently in use: the trench capacitor and the stacked capacitor. Both types of nonplanar capacitors typically require a considerable greater number of masking, deposition and etching steps for their manufacture than does a planar capacitor.

In a trench capacitor, charge is stored primarily vertically, as opposed to horizontally in a planar capacitor. Since trench capacitors are fabricated in trenches which are etched in the substrate, the typical trench capacitor, like the planar capacitor, is subject to soft errors. In addition, there are several other problems inherent in the trench design. One problem is that of trench-to-trench charge leakage, caused by the parasitic transistor effect between adjacent trenches. Another problem is the difficulty of completely cleaning the trenches during the fabrication process; failure to completely clean a trench will generally result in a defective cell.

The stacked capacitor design, on the other hand, has proven somewhat more reliable and easier to fabricate than the trench design. Since both the lower and the upper plates of a typical stacked capacitor are formed from individual polysilicon layers, the stacked capacitor is generally much less susceptible to soft errors than either the planar or trench capacitors. By placing both the wordline and the digit line beneath the capacitive layers, and having the lower layer make contact with the substrate by means of a buried contact, some manufacturers have created stacked capacitor designs in which vertical portions of the capacitor contribute significantly to the total charge storing capacity. Since a stacked capacitor generally covers not only the entire area of a cell (including the cell's access FET), but adjacent field oxide regions as well, capacitance is considerably enhanced over that available from a planar type cell.

The method for forming the typical fin configuration stacked capacitor uses polysilicon/nitride layers to implement spacing of the fins. The method is complicated and employs multi depositions and subsequent etch steps to create this stacked capacitor fin structure.

One experimental storage-node capacitor comprises the double-wall crown shaped lower capacitor plate structure wherein the fabrication of the structure is initiated by etching an opening in an $SiO_2$ interlayer in order to expose a contact area of the substrate. Polycrystalline silicon is then deposited to overlie the surface of the $SiO_2$ interlayer and the substrate contact area. Next portions of $SiO_2$ are formed adjacent to the polycrystalline silicon overlying sidewalls of the opening. A second polycrystalline silicon layer is then deposited overlying the portions of $SiO_2$ and overlying and contacting the polycrystalline silicon overlying the contact area. The remaining portion of the opening is filled with $SiO_2$. The polycrystalline silicon overlying the $SiO_2$ is etched and then the $SiO_2$ is etched. The remaining polycrystalline silicon comprises the lower capacitor plate of a storage node capacitor. Thus the lower capacitor plate comprises a two layer lower portion of polycrystalline silicon in contact with the substrate and having four vertical fingers extending from the lower portion.

Other alternatives for increasing capacitance comprise utilizing materials having larger dielectric constants, decreasing the thickness of the dielectric (decreasing the distance between the capacitor plates), or increasing capacitor surface area by texturizing the polysilicon surface.

SUMMARY OF THE INVENTION

The invention is a product and method for forming the same comprising a storage contact capacitor of a dynamic random access memory (DRAM) device wherein the storage node capacitor plate comprises first and second capacitor portions. The first portion is a self-aligned tungsten and TiN core. The self-aligned tungsten and TiN core is fabricated in a self-aligned opening exposing a contact region of the silicon substrate. The opening is created by masking and etching previously fabricated layers of the semiconductor device. The TiN layer is interposed between the tungsten and the previously fabricated layers. The storage contact capacitor of the invention utilizes the vertical portion of the DRAM by fabricating the tungsten and TiN core vertically in the DRAM. The vertical fabrication increases capacitor area while maximizing die space. Therefore capacitance increases as the height of the tungsten and TiN core increases.

In both the first and second embodiments an upper polysilicon layer functions as the cell capacitor plate and is insulated from the storage node capacitor plate by a dielectric layer.

In the first embodiment the second portion of the storage node capacitor plate is a storage node polysilicon deposited and subjected to an insitu phosphorous diffusion doping. The storage node polysilicon is self-aligned to the row line poly and to the buried contact pattern. The horizontal component of the capacitor provided by the polysilicon layer does not contribute significantly to the capacitance. Therefore the storage node contact size can be minimized horizontally without adversely affecting the total capacitance. For a 4-megabit application, the top of the core may be used as the only contact for the storage node polysilicon. In a more dense application the storage node polysilicon contacts vertical sides of the tungsten and TiN core as well as the top of the core.

In the second embodiment the second portion of the storage node capacitor plate is fabricated by alternatingly depositing layers of tungsten and TiN. The alternating layers are RIE etched to define the area of the second portion. The TiN is then isotropically and controllably etch to form tungsten fingers stacked elevationally and horizontally over at least the tungsten and TiN core.

Both the first and second embodiments allow the vertical portion of a DRAM device to be utilized as the storage cell thus maximizing die space in the horizontal direction, and reducing the stack capacitor height prior to contacts.

In the first embodiment a reactive ion etch (RIE) storage node polysilicon etch maximizes the cell size over the cell size attainable when utilizing a wet poly etch. The cell plate contact and the cell plate are self-aligned. A mask step is eliminated over previous methods since there is no cell poly mask. The process facilitates the effective use of a buried digit line configuration. In addition there are no bit line stringers, thus yield is increased.

Also in the second embodiment the process is simpler than that employed in fabricating conventional staked capacitors. The alternating tungsten layers may be thin thus minimizing capacitor height while utilizing no additional masks.

DETAILED DESCRIPTION OF THE PREFERRED EMBODIMENT

The invention is storage cell capacitor. Two embodiments of the invention are directed to maximizing storage cell capacitance utilizing minimal masking steps. The capacitor of each cell makes a self-aligned contact with a buried contact within the cell, while the capacitor extends to the active area of an adjacent cell. The active areas can be arranged in interdigitated columns and noninterdigitated rows or simply parallel and in line to one another in both the vertical and horizontal directions. The rows are referred to as wordlines and the columns are referred to as digit lines or bit lines. The active areas are used to form active metal-oxide semiconductor (MOS) transistors that can be doped as NMOS or PMOS type FETs depending on the desired use. The invention is a storage contact capacitor utilizing the vertical portion of the dynamic random access memory (DRAM) in which to fabricate a tungsten and TiN core to function as a portion of the storage node capacitor plate and the invention is the method for fabricating the same.

The process steps of the invention are shown pictorially in FIGS. 1-22. FIGS. 1-8 are pertinent to both embodiments of the invention. FIGS. 9-14 are pertinent to the first embodiment, and FIGS. 15-22 are pertinent to the second embodiment.

Figure 1:
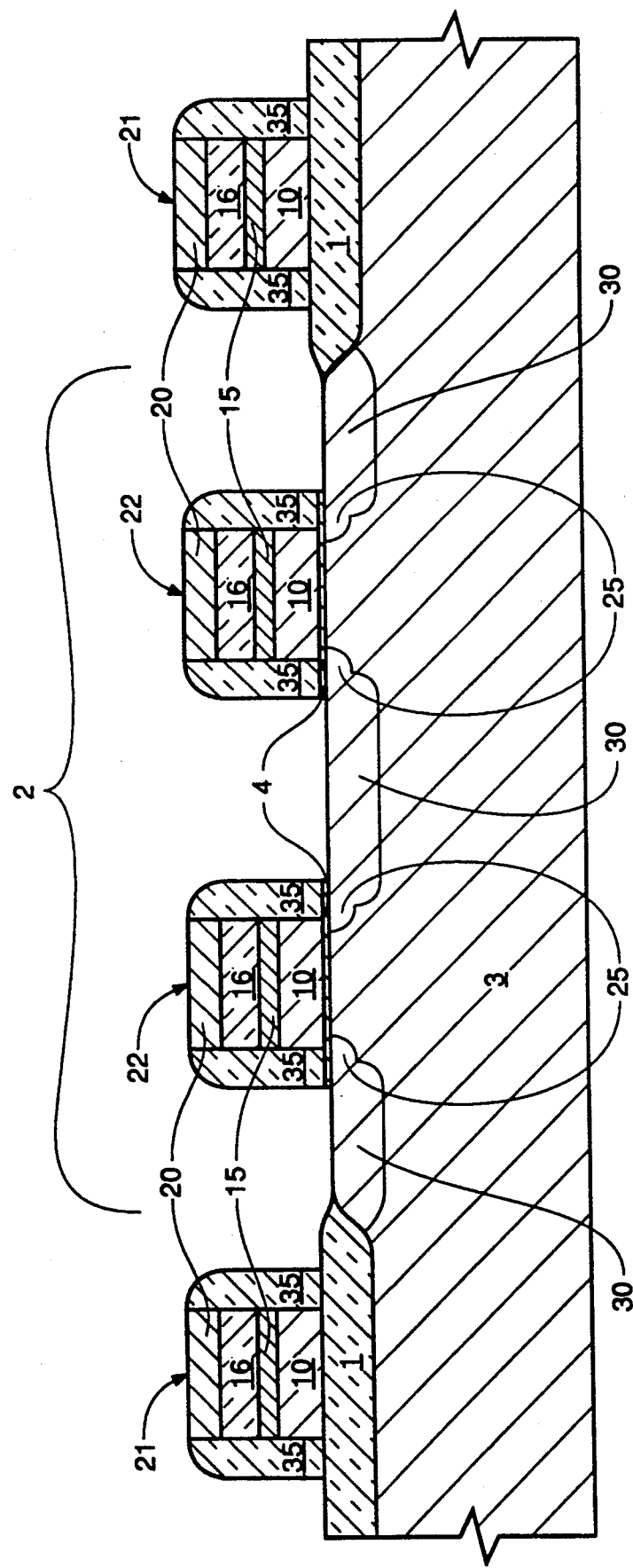
FIG. 1 is a cross-sectional view of a portion of a partially-processed semiconductor wafer which depicts field-effect transistors (FETs) overlying a silicon substrate and wordlines overlying field oxide.

Referring now to FIG. 1, a cross-sectional view of two in-process DRAM cells is shown following conventional local oxidation of silicon (LOCOS) or special LOCOS processing which creates substantially planar field oxide regions 1 (created using modified LOCOS process) and future active areas 2 (those regions of the substrate not covered by field oxide) on a silicon substrate 3. The creation of the field oxide is preceded by a thermally grown dielectric layer 4 of silicon oxide. The depicted cells are two of many cells that are fabricated simultaneously and comprise a memory array. Following the creation of the field oxide region 1 and dielectric layer 4 a first conductively doped polysilicon layer 10, a metal silicide layer (WSi$_X$) 15, an oxide layer 16, and a thick nitride layer 20 are deposited. The thick nitride layer 20 will function as an etch stop during the storage node buried contact etch, thus allowing self-alignment. The layers are patterned and etched to form wordlines 21 and N-channel (NCH) field effect transistors 22. The polysilicon layer 10 forms the gate regions of the FETs and is insulated from lightly-doped source/drain regions 25 by the dielectric layer 4. The lightly-doped regions 25 are created utilizing a phosphorus implant. Deposition, densification and a reactive ion etch (RIE) of a silicon dioxide spacer layer has created principal spacers 35 which offset an arsenic implant used to create the heavily-doped source/drain regions 30. Principal spacers 35 insulate the wordlines and FETs from subsequent digit line and capacitor fabrications. Eventually the wordlines are connected to periphery contacts. The periphery contacts are located at the end of the array and are capable of being in electrical communication with peripheral circuitry.

After the RIE etch the punchthrough improvement implant is processed to improve breakdown voltage of drain to source when V$_{Gate}$ equals zero volts (BVDSS) and reduce subthreshold leakage. The gate oxide 4 remains intact and the field oxide is not etched.

Although the formation of the FET 22 and wordlines 21 as described are preferred, other methods of fabrication are also feasible and perhaps equally viable. The following steps represent the method of the preferred embodiment for creating the storage capacitor of the invention.

Figure 2:
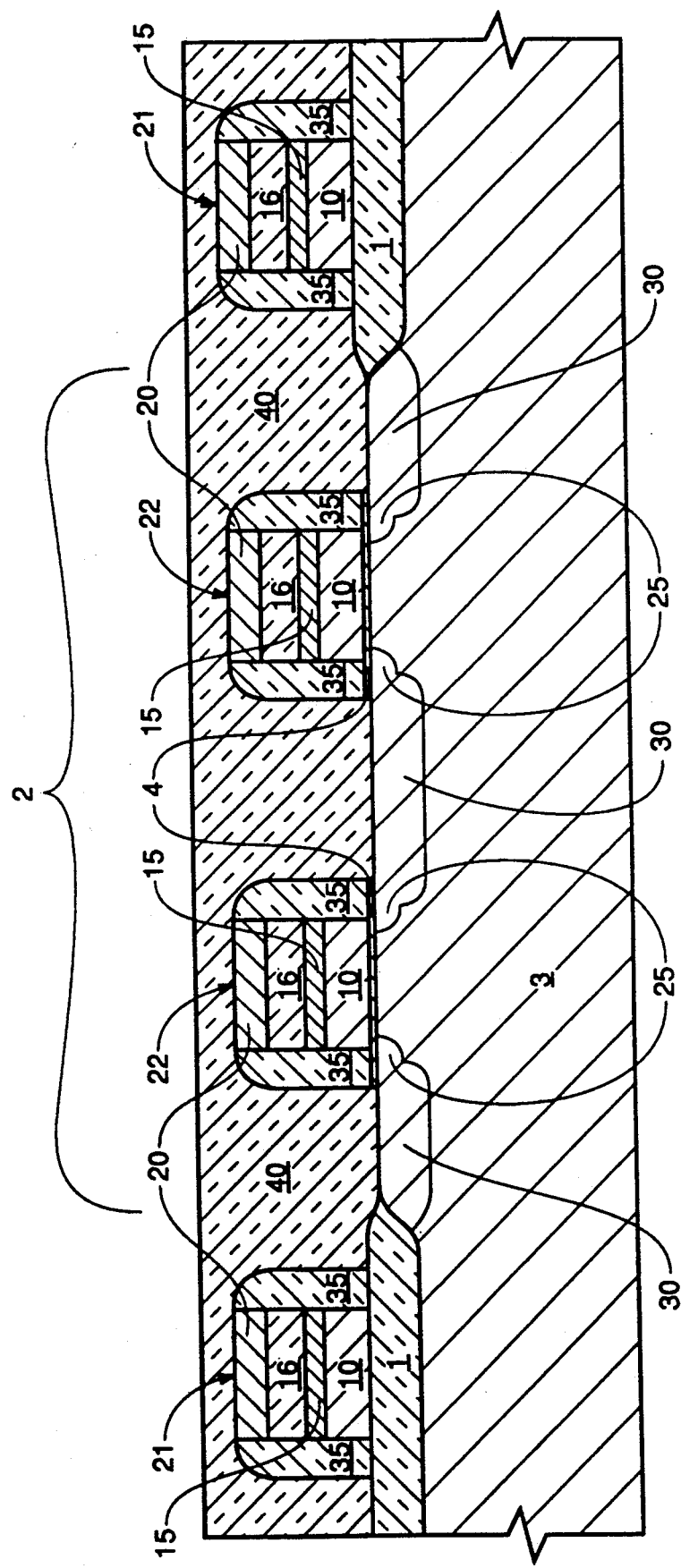
FIG. 2 is a cross-sectional view of the wafer portion of following the deposit of an undoped thick oxide layer and planarization thereof.

In FIG. 2 a conformal layer of undoped oxide 40 is blanket deposited to fill the storage node areas and overlie the FETS 22 and wordlines 21. The oxide is undoped to minimize dopant out diffusion from the oxide 40 to the doped regions of the substrate. The oxide is planarized in order to provide a uniform height.

Figure 3:
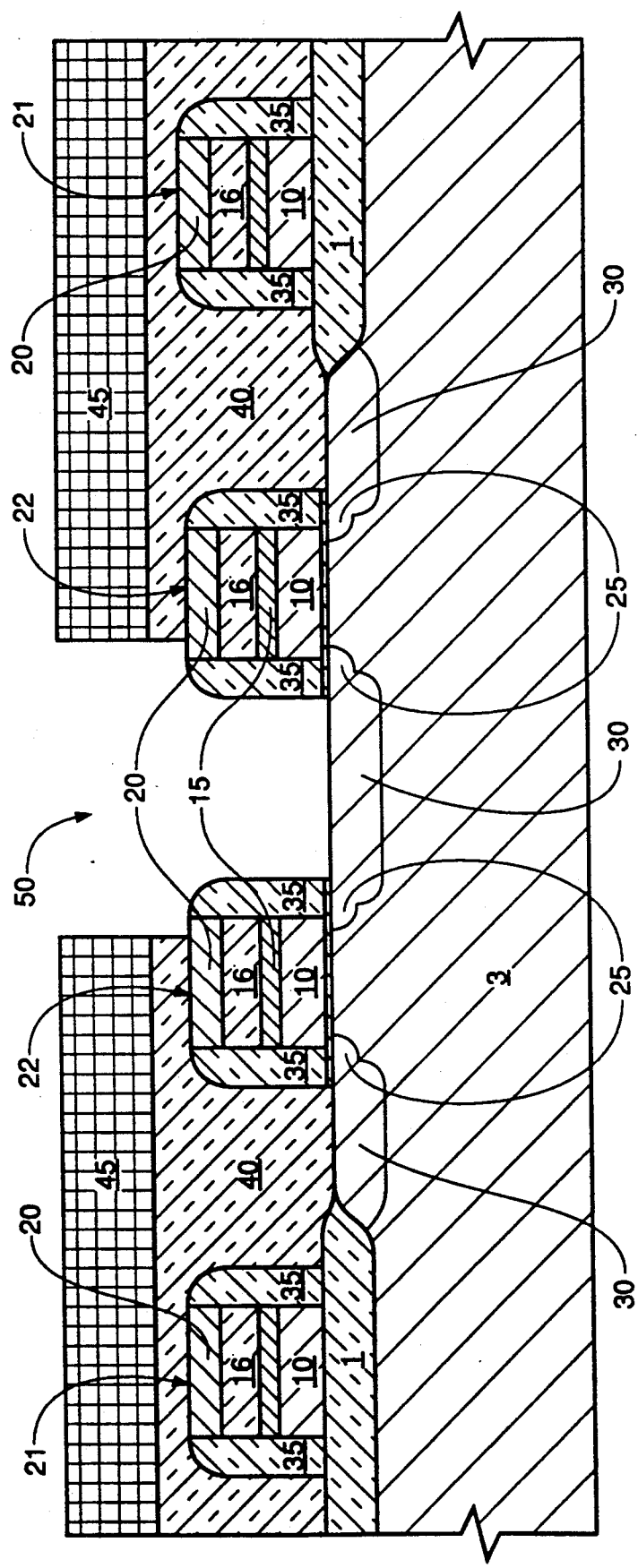
FIG. 3 is a cross-sectional view of the wafer portion of FIG. 2 following the masking and subsequent etching of the deposited oxide layer to form a self-aligned opening.

In FIG. 3 a photoresist digit line contact 45 is used as an etch mask to create an opening 50 in which buried digit lines will be fabricated. The nitride layers 20 and principal spacers 35 protect the transistor polysilicon layer 10 from the RIE oxide etch employed to form opening 50. The protection afforded by the nitride layers 20 and principal spacers 35 effect self-alignment of the opening.

Figure 4:
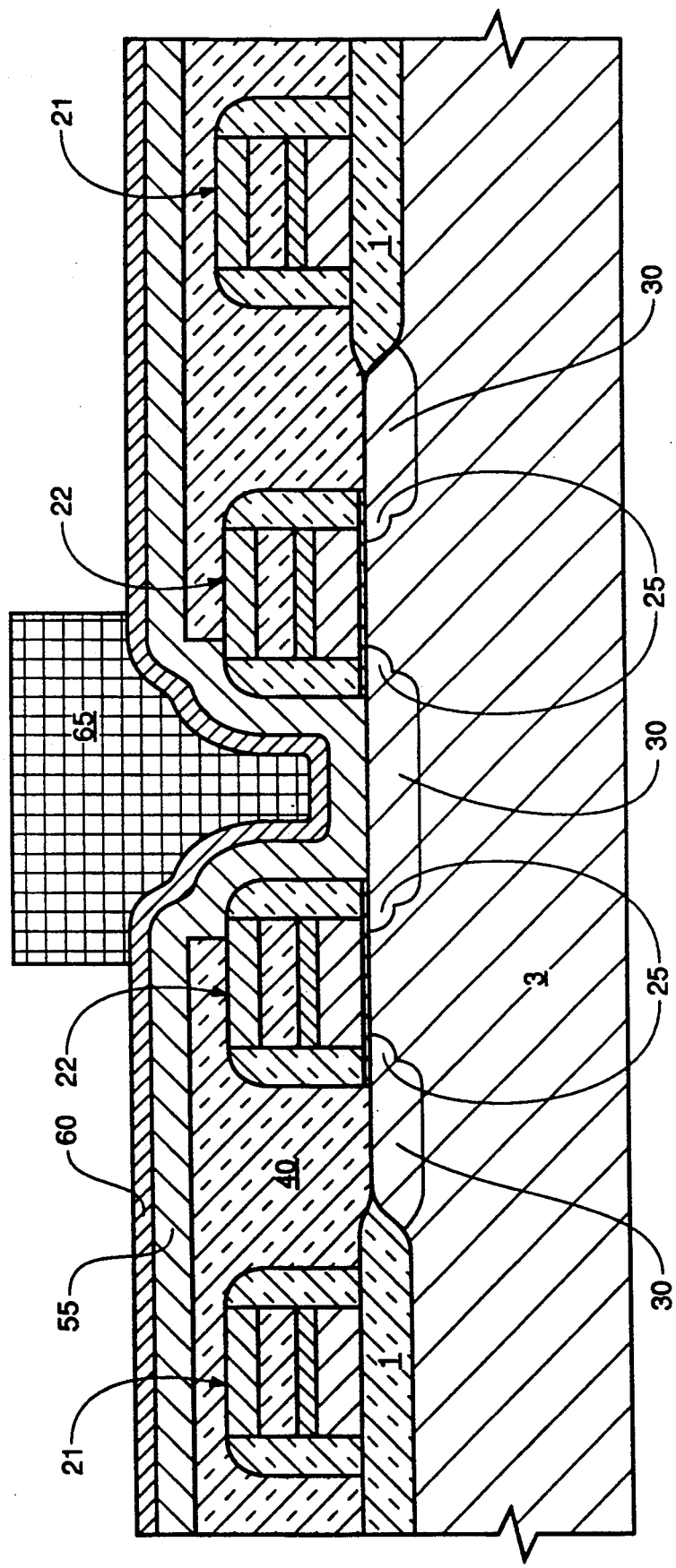
FIG. 4 is a cross-sectional view of the wafer portion of FIG. 3 following the masking of deposited layers of polysilicon and WSi$_x$.

In FIG. 4 the photoresist shown in FIG. 3 has been removed, and the previously defined structures are overlaid with a blanket deposition of polysilicon 55 which in turn is overlaid with a blanket deposition of strapping material 60 comprising WSi$_X$ or TiN. The area defined as the digit line is masked with photoresist 65.

Figure 5:
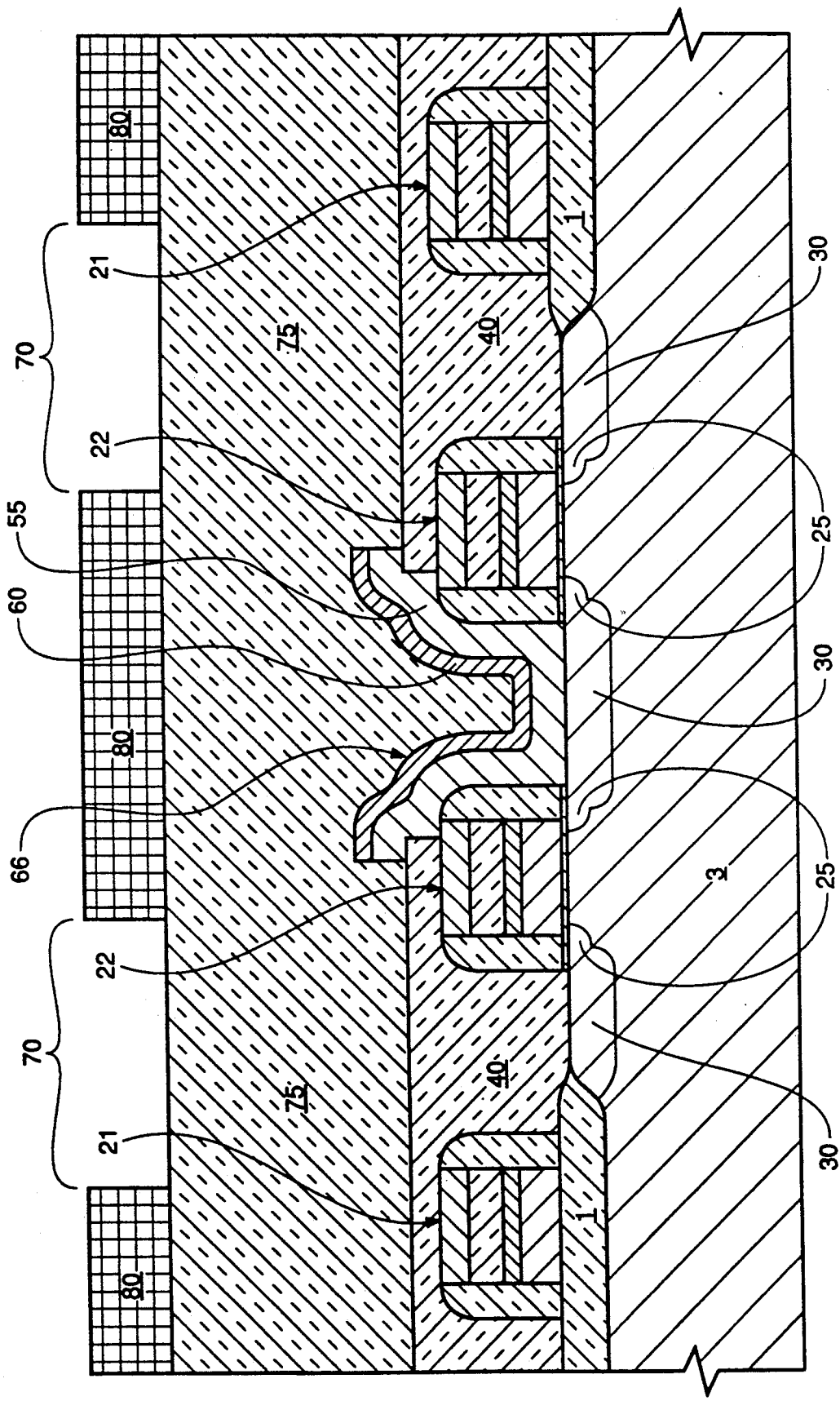
FIG. 5 is a cross-sectional view of the wafer portion of FIG. 4 following a reactive ion etch (RIE) of the deposited polysilicon and WSi$_x$ layers to form a buried digit line and following the deposit of a thick doped oxide layer and masking thereof to define future contact areas for storage contact capacitors.

In FIG. 5 the unmasked polysilicon 55 and strapping material 60 are RIE etched to remove them from over the storage node areas 70 and from the top of the wordlines 21 poly. The polysilicon 55 and strapping material 60 that are retained after the etch define the digit line 66. The strapping material 60 has a relatively low resistance when compared to the resistance of the polysilicon layer 55. The lower resistance of the strapping material 60 reduces the overall resistance of the digit line 66. Eventually the digit lines will be connected to periphery contacts. The periphery contacts are located ate the end of the array and are capable of being in electrical communication with peripheral circuitry.

The photoresist 65 shown in FIG. 4 is removed. A thick doped layer of borophosphosilicate glass (BPSG) oxide 75 is blanket deposited to overlie the structures of FIG. 5. The thick oxide layer 75 is deposited to the desired height of the tungsten and TiN core. After planarization, either mechanical or chemical, the thick oxide 75 is masked with photoresist pattern 80 to define future openings in the previously fabricated structures for future storage capacitors. Planarizing the thick oxide 75 eliminates bit line stringers. The photoresist pattern 80 can also be used as a contact layer pattern for periphery contacts, thereby eliminating one mask, a buried contact mask. In this case openings would also be etched in the periphery of the DRAM device.

Figure 6:
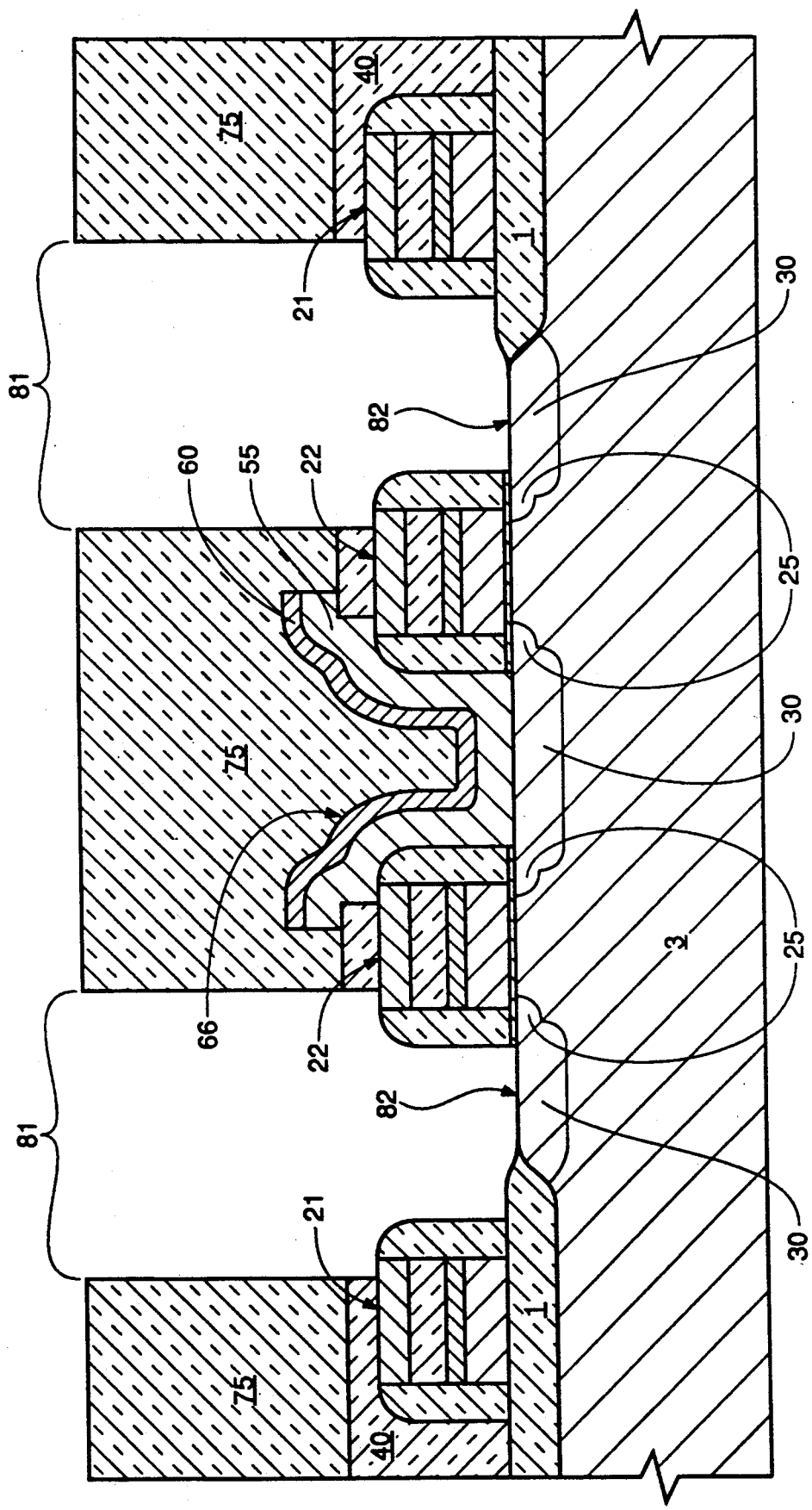
FIG. 6 is cross-sectional view of the wafer portion of FIG. 5 following an RIE etch of the oxide layers to create openings for the lower capacitor plates as well as the contact openings for periphery contacts and following the removal of the photoresist.

In FIG. 6 the oxide layers 40 and 75 are RIE etched to form opening 81 and expose the contact areas 82 of the substrate, and then the photoresist 80 shown in FIG. 5 is removed.

Figure 7:
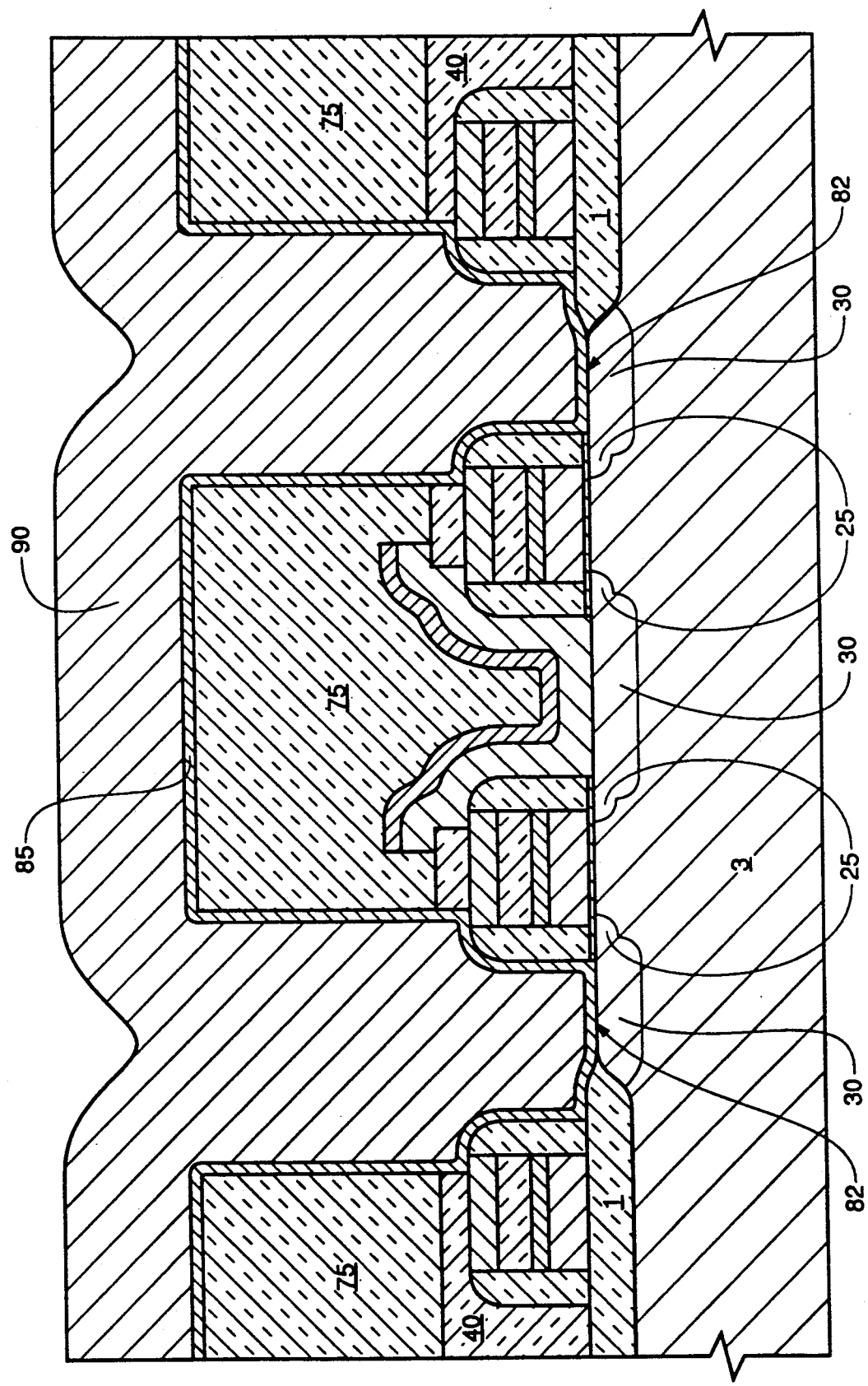
FIG. 7 is a cross-sectional view of the wafer portion of FIG. 6 following the deposition of a thin TiN layer and a tungsten fill of the opening.

In FIG. 7 a TiN deposition 85 has been followed by tungsten fill deposition 90.

TiN is a diffusion barrier metal providing a diffusion barrier between the N+ junction and the tungsten. The TiN also provides a low contact resistance without damaging the contact area of the substrate. TiN 85 is deposited first since it can be uniformally and evenly distributed to contact the previously fabricated areas and it provides a good contact medium for the subsequent tungsten fill 90. The TiN also provides electrical communication between the substrate contact areas 82 and the tungsten. It is conceivable that TiN may be replaced with other diffusion barrier materials having similar properties. A thickness of 500 Å to 1000 Å is typically sufficient to provide the advantages described herein.

Tungsten is a highly conductive refractory metal that can withstand high temperatures in the range of 600° C. to 900° C. This is necessary due to a subsequently deposited polysilicon layer. The polysilicon deposition is typically in the vicinity of 650° C. The tungsten can be replaced with other refractory metals comprising $WSi_x$, titanium, and titanium silicide. It is conceivable that as technology advances processing steps subsequent to the tungsten deposition may be performed at higher or lower temperatures. The temperature parameters qualify the refractory metal and are indicative of the current process, therefore, the temperature parameters may change as the process evolves.

Figure 8:
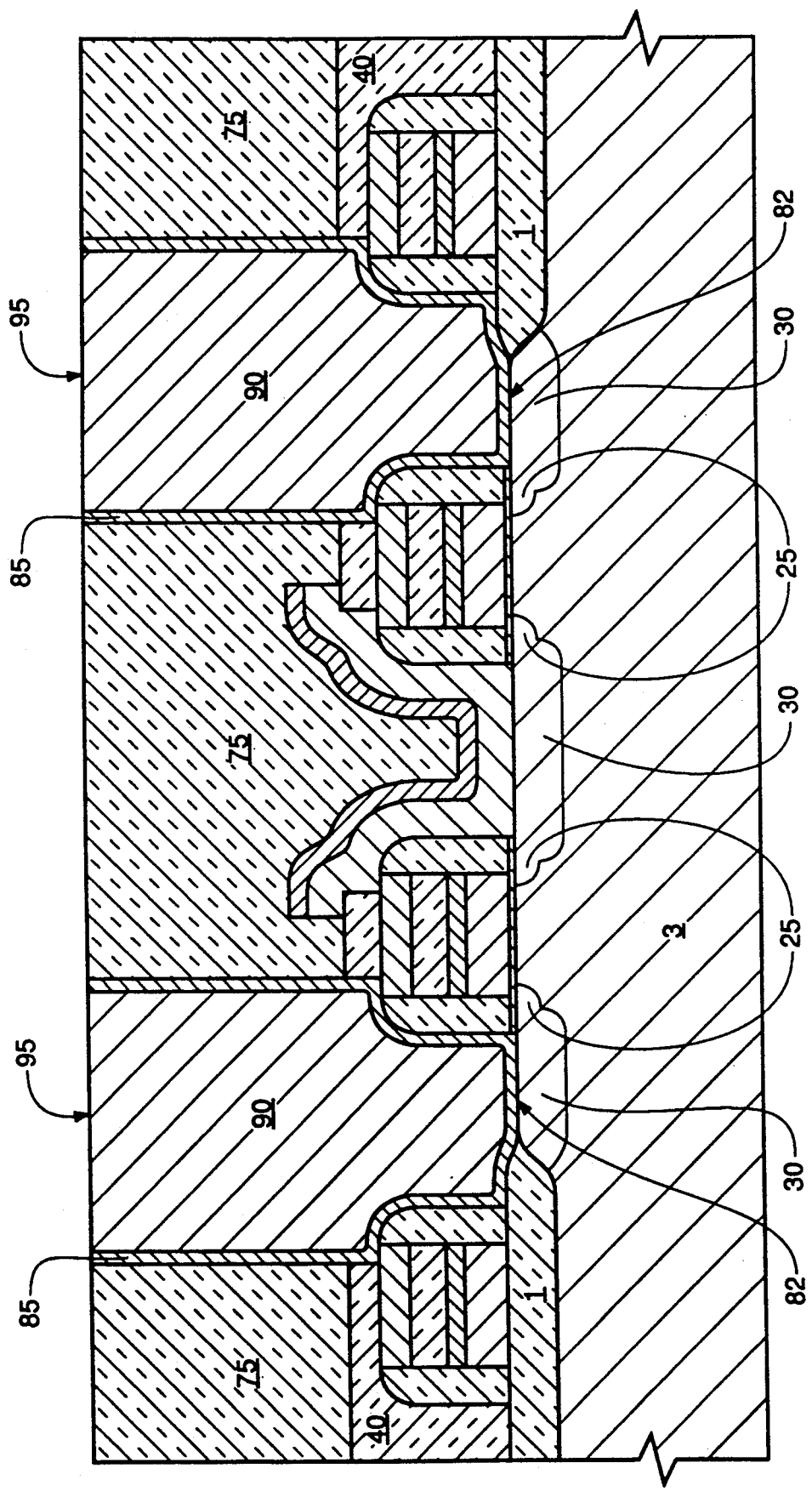
FIG. 8 is a cross-sectional view of the wafer portion of FIG. 7 following a planarization of the TiN and tungsten to form a core.

The tungsten 90 and TiN 85 form a core 95 and are shown in FIG. 8 after a mechanical etch to effect planarization of the tungsten 90, TiN 85 and thick oxide 75. The core 95 forms the contact portion of the lower capacitor plate, since this portion is in contact with the substrate contact area 82. Utilizing tungsten as the lower capacitor plate slightly increases the average capacitance over the $V_{CC}$ range of the storage contact capacitor over that of the prior art due to the lower resistivity of the tungsten when compared to the higher resistivity of a typical storage node comprising polysilicon.

Figure 9:
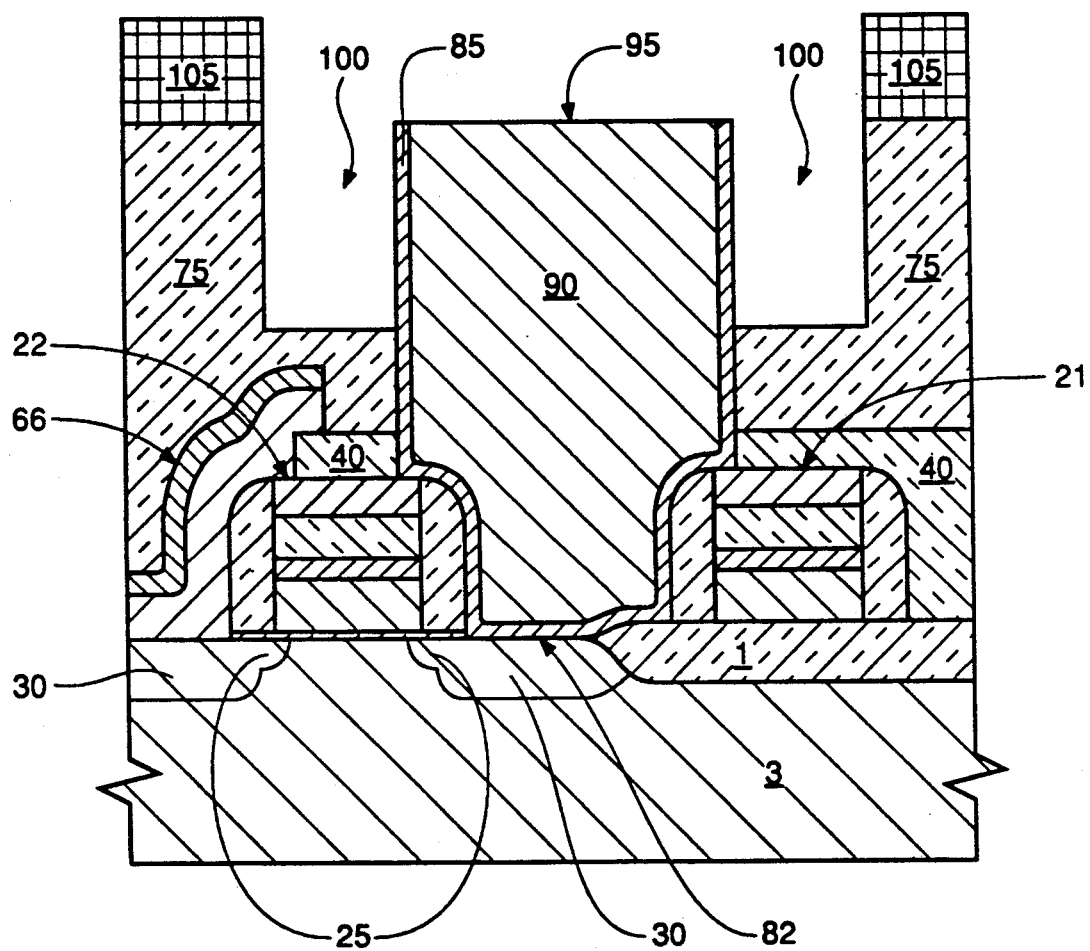
FIG. 9 is a cross-sectional view of a portion of the wafer portion of FIG. 8 following the patterning and etch of the oxide layer surrounding the upper portion of the tungsten and TiN core.

In a first embodiment capacitance is increased by increasing the size of the storage node plate. To this end the thick oxide 75 is etched in areas surrounding an upper portion of the core 95. The etch forms a deep trench 100 about 0.5 micron from the top of the tungsten and TiN core as shown in FIG. 9 which depicts a portion of the wafer portion shown in FIG. 8. A photoresist mask 105 provides protection to oxide areas not being etched. The oxide etch is not sufficient to expose the wordlines 21 and the digit line 66, and they remain insulated with the oxide. This oversizing of the storage node contact by forming the trench 100 surrounding the core 95 is optional in a 4-megabit memory cell design where a planar area of 6 to 8 micron square provides enough capacitor area. A capacitor fabricated planar to the top of the tungsten and TiN core provides the minimal capacitor area required for the 4-megabit memory cell and the trench 100 is an unnecessary step.

Figure 10:
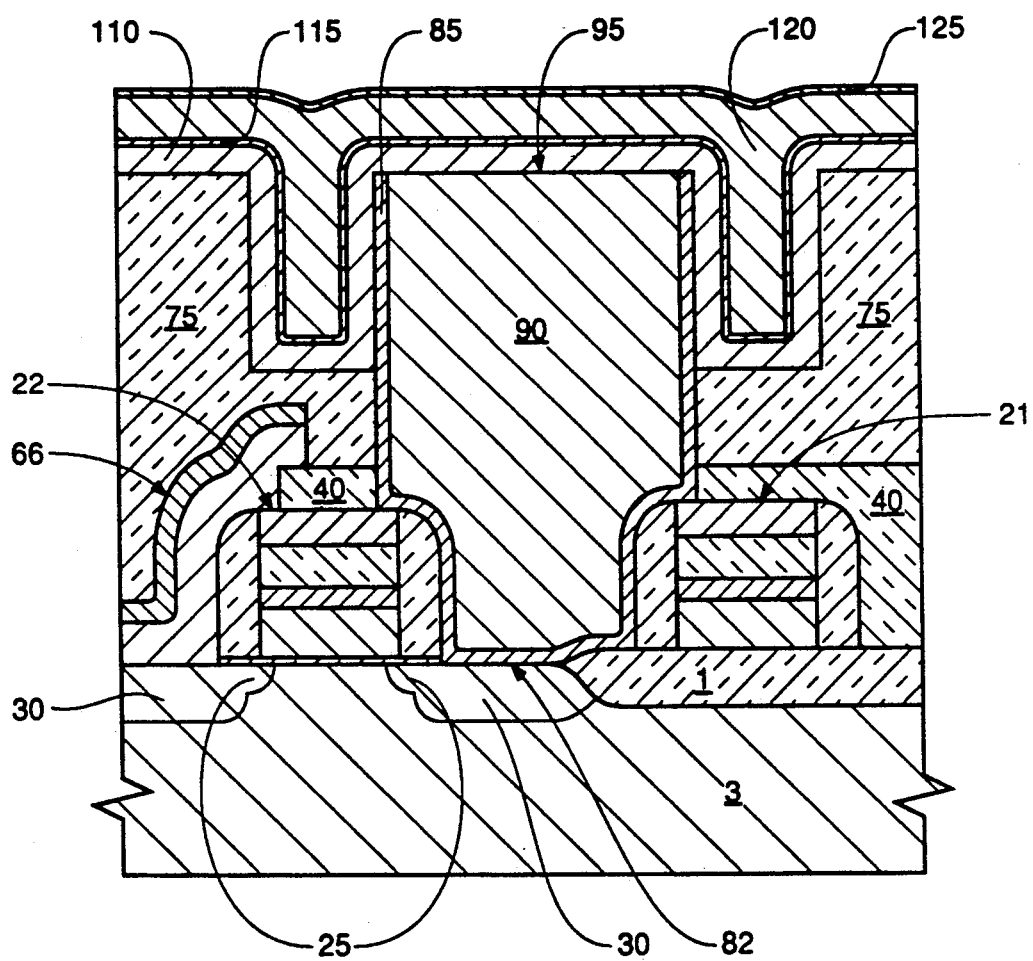
FIG. 10 is a cross-sectional view of the wafer portion of FIG. 9 following the removal of the photoresist shown in FIG. 9 and following the deposition of two polysilicon layers interposed with a dielectric layer and overlaid with a nitride layer.

In FIG. 10 the photoresist 105 shown in FIG. 9 is removed and a thin storage node polysilicon layer 110 is blanket deposited over the oxide 75 and the core 95. The storage node polysilicon layer 110 is subjected to an insitu phosphorous diffusion doping to decrease the resistivity of the polysilicon. At this juncture the storage node capacitor plate comprises the storage node polysilicon layer 110 and the core 95. Following the phosphorous doping a thin dielectric layer 115 typically comprising silicon nitride is blanket deposited overlying the storage node polysilicon layer. Other dielectric materials such as silicon dioxide are equally viable alternatives for the dielectric layer 115. The silicon nitride deposit is followed by a wet anneal to oxidize the nitride layer and to oxidize the silicon in pinholes of the nitride layer. The wet anneal provides improved dielectric breakdown properties of the capacitor thus formed. A thick cell polysilicon layer (cell poly layer) 120 is deposited overlying the dielectric layer 115. The thick cell poly layer 120 is subjected to an insitu phosphorous diffusion doping to decrease its resistivity. The cell plate comprises the cell poly layer 120. In order to protect the thick cell poly layer 120 during subsequent oxidization steps of the fabrication process a thin layer of oxidation resistant silicon nitride 125 is blanket deposited to overlie the thick cell poly layer 120.

Figure 11:
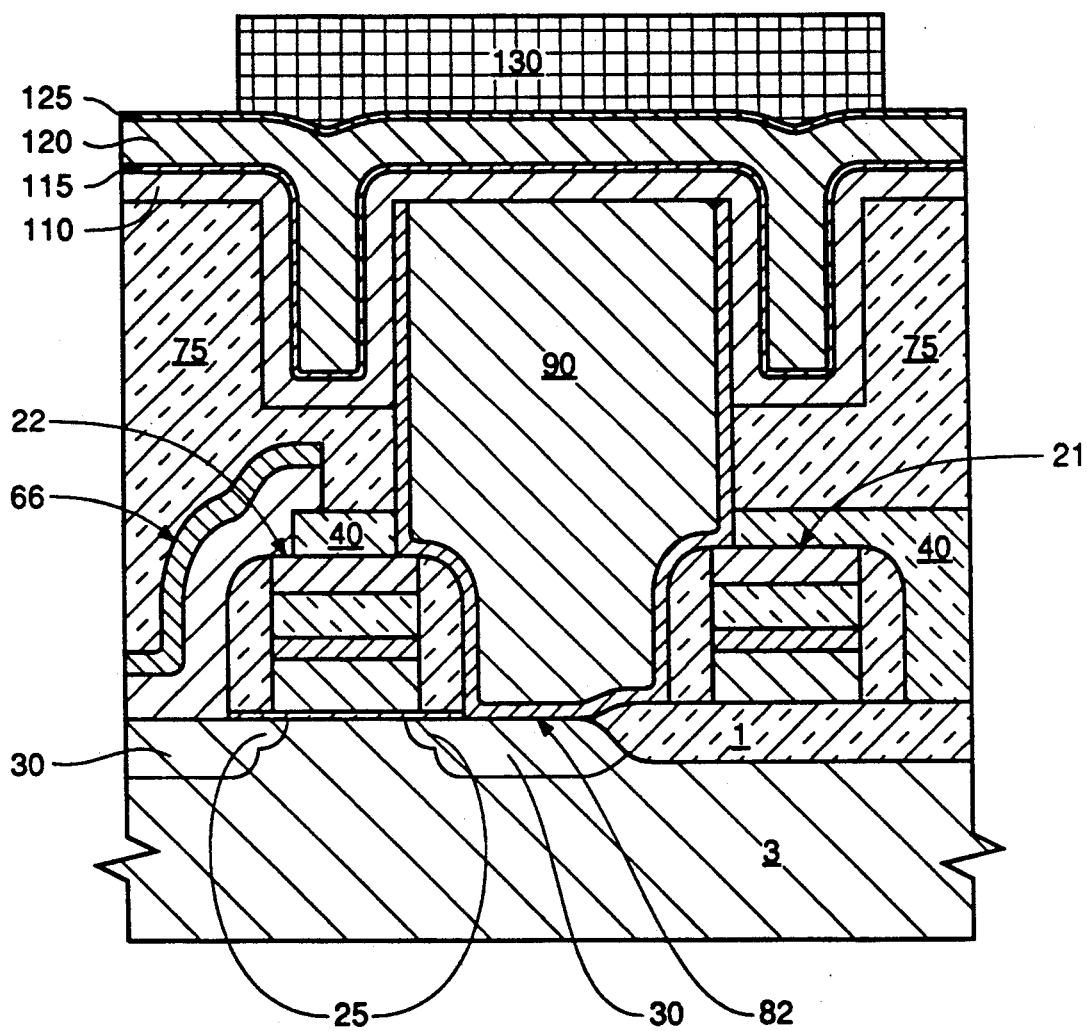
FIG. 11 is a cross-sectional view of the wafer portion of FIG. 10 following patterning of the storage capacitor with photoresist.

The cell poly layer 120 capacitors are patterned only within the storage capacitor with photoresist mask 130 as shown in FIG. 11.

Figure 12:
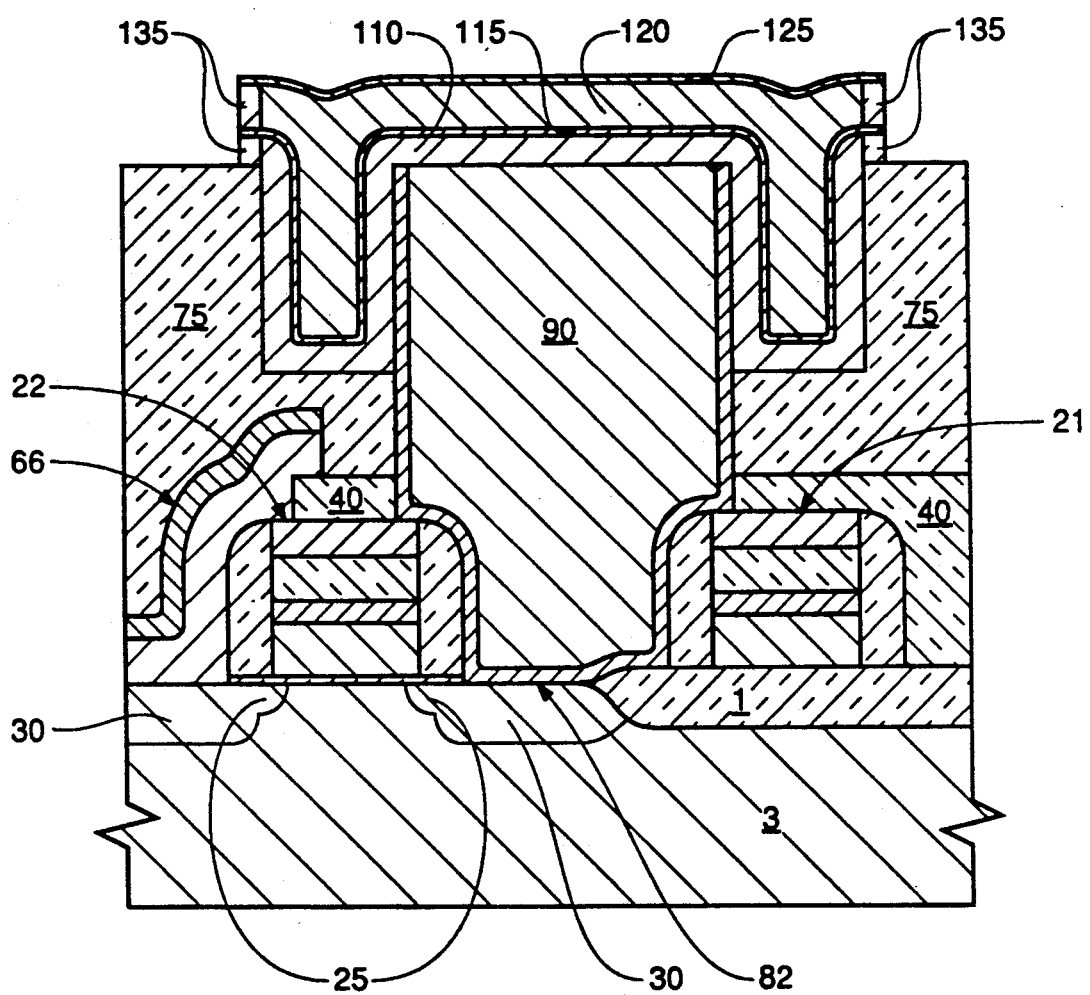
FIG. 12 is a cross-sectional view of the wafer portion of FIG. 11 following an RIE etch of the polysilicon, dielectric layer and nitride layer and following the oxidation of the polysilicon exposed during the etch.

In FIG. 12 storage node polysilicon layer 110, cell poly layer 120, and nitride layers 115 and 125 are RIE etched in the unmasked areas, and the photoresist 130 as shown in FIG. 11 is removed. Oxide 135 is grown to insulatively seal the sides of the polysilicon layers 110 and 120.

Figure 13:
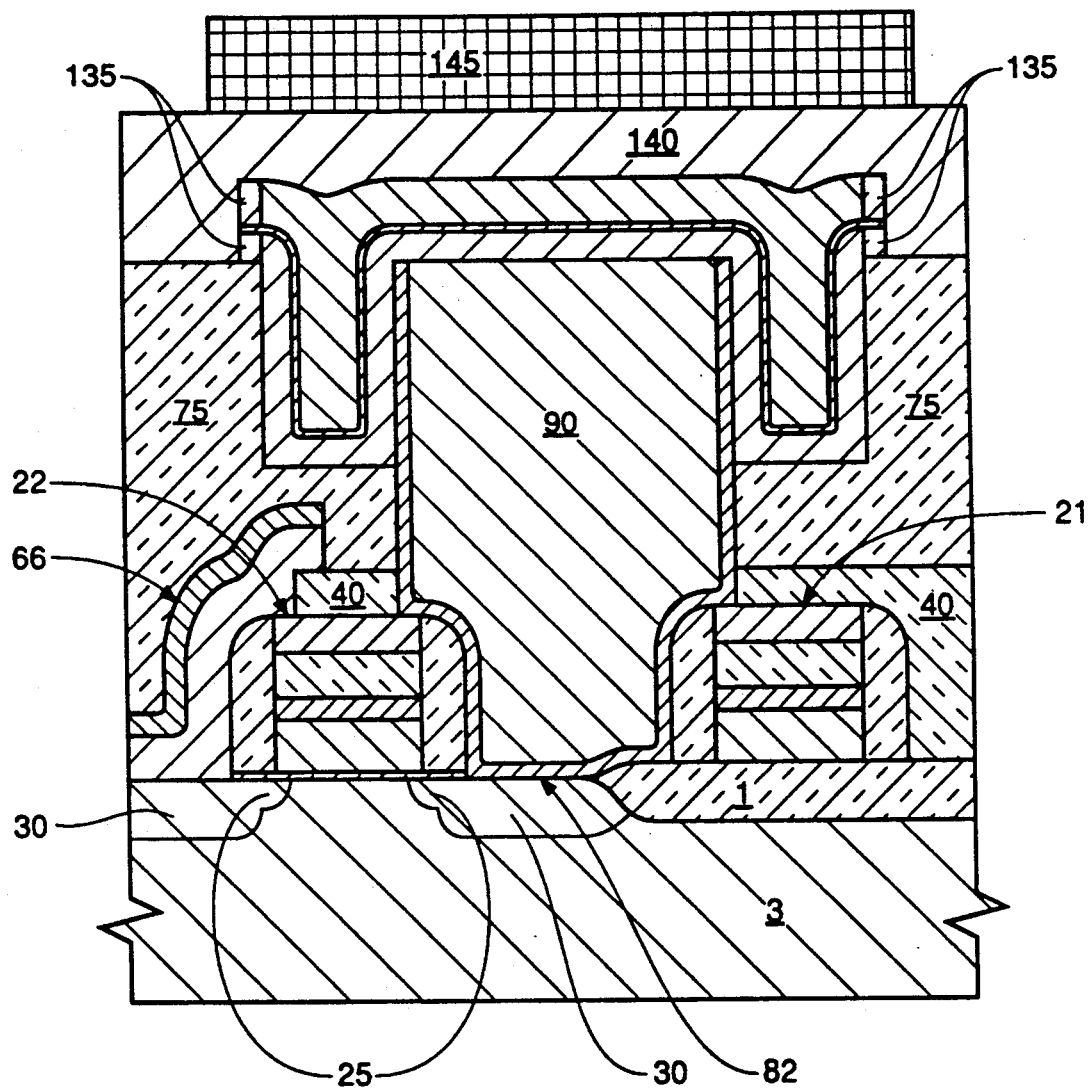
FIG. 13 is a cross-sectional view of the wafer portion of FIG. 12 following an RIE etch of the top nitride layer and following the deposition of a conductive layer, and following the noncritical patterning of the cell array.

In FIG. 13 the top thin silicon nitride layer 125 shown in FIG. 12 is RIE etched and a layer of conductive material 140 is deposited to create a cell poly interconnect and eliminate a cell poly mask. The conductive material 140 preferably comprises a metal such as aluminum, Al/Si/Cu, tungsten, or another aluminum/copper alloy. This layer of conductive material 140 is used throughout the circuit periphery. In order to retain the conductive material overlying and in contact with the thick polysilicon layer the conductive material is masked by photoresist 145 in a noncritical alignment pattern over the cell array in order to connect all the cell poly over the storage node. Since the cell poly is aligned with the storage node polysilicon pattern, a cell poly masking step is eliminated.

Figure 14:
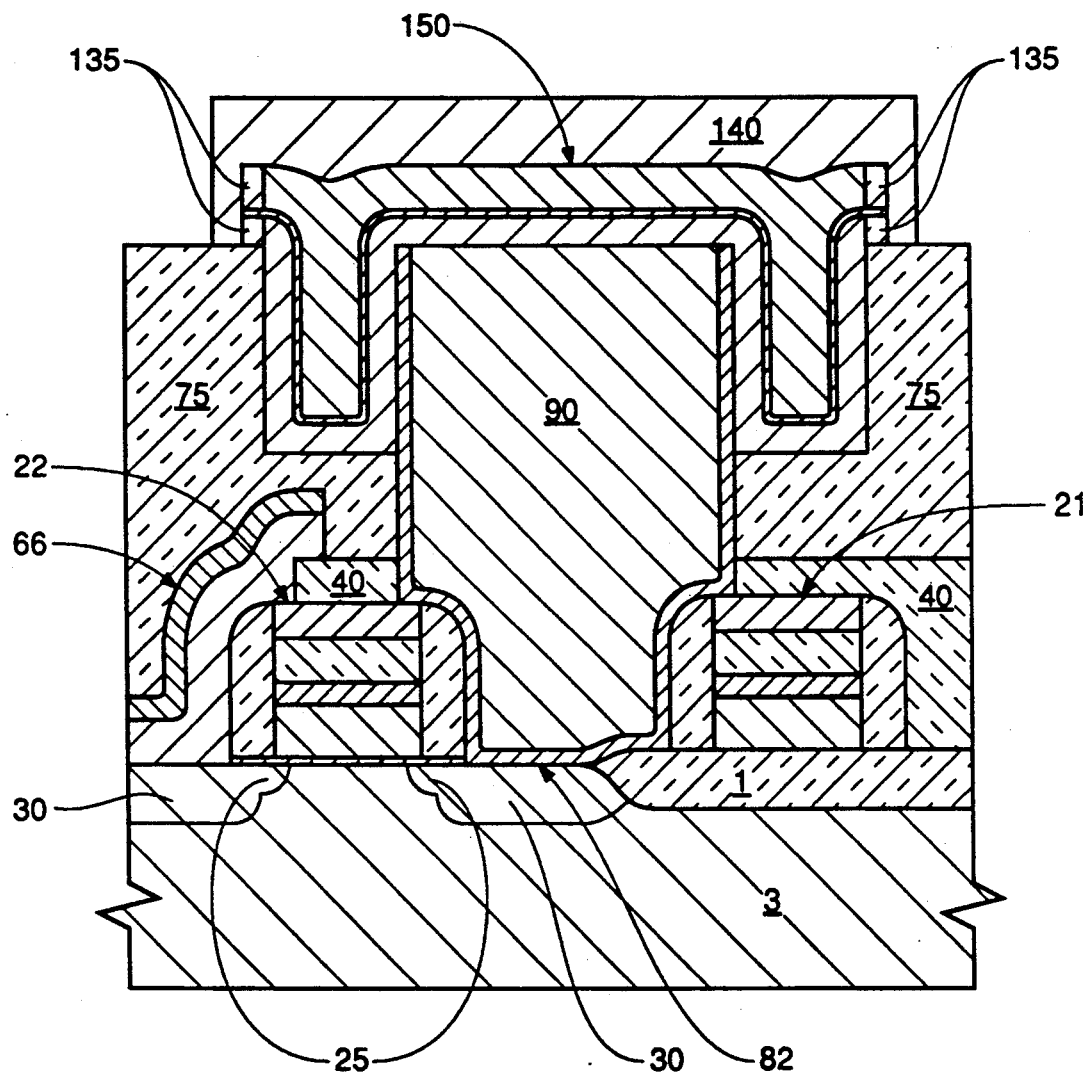
FIG. 14 is a cross-sectional view of the wafer portion of FIG. 13 following an RIE metal etch of the conductive layer.

In FIG. 14 the unmasked conductive material 140 is RIE metal etched and the fabrication of storage capacitors 150 is complete. The storage node capacitor plates of storage capacitors 150 comprise the tungsten/titanium nitride core 95 and the storage node polysilicon layer 110. The cell plate comprises the thick polysilicon layer 120. The conductive material 140 provides electrical communication between the cell plates of the capacitors 150 fabricated by the method of the invention. The cell plate and storage node capacitor plate are separated from each other and insulated by the dielectric layer 145.

A second embodiment of the invention is a storage contact capacitor utilizing the vertical portion of the DRAM in which to fabricated a tungsten and TiN core and utilizing alternatingly deposited layers overlying the tungsten and TiN core to form elevationally stacked fingers, the core and the fingers forming the storage node capacitor plate.

Figure 15:
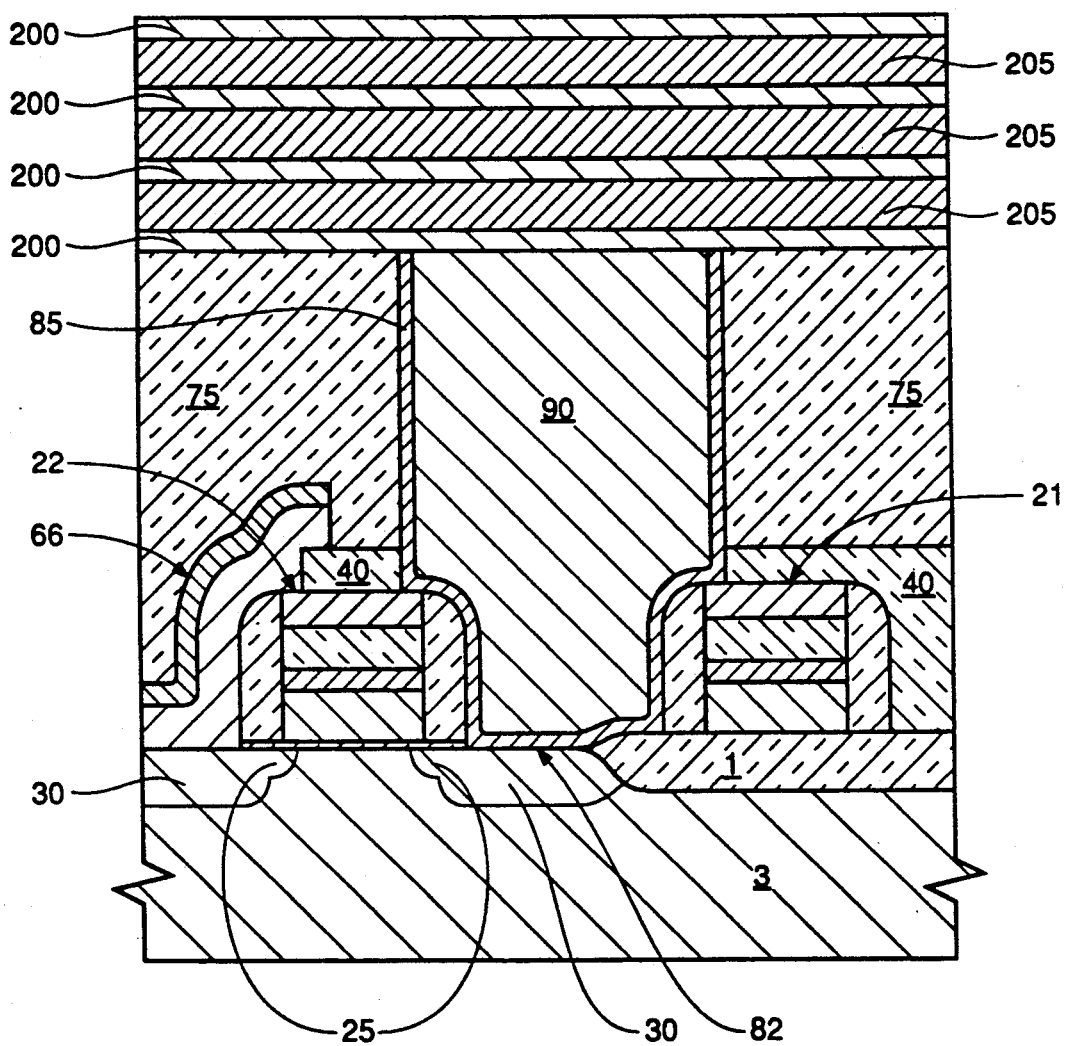
FIG. 15 is a cross-sectional view of a portion of the wafer portion of FIG. 8 following alternating depositions of tungsten and TiN.

In the second embodiment the tungsten and TiN core is fabricated according to process steps described with reference to FIGS. 1 through 8. FIG. 15 shows a portion of FIG. 8 after layers of tungsten 200 and TiN 205 have been alternately deposited to overlie the planarized surfaces of the oxide 75, the tungsten 90, and the TiN 85.

Figure 16:
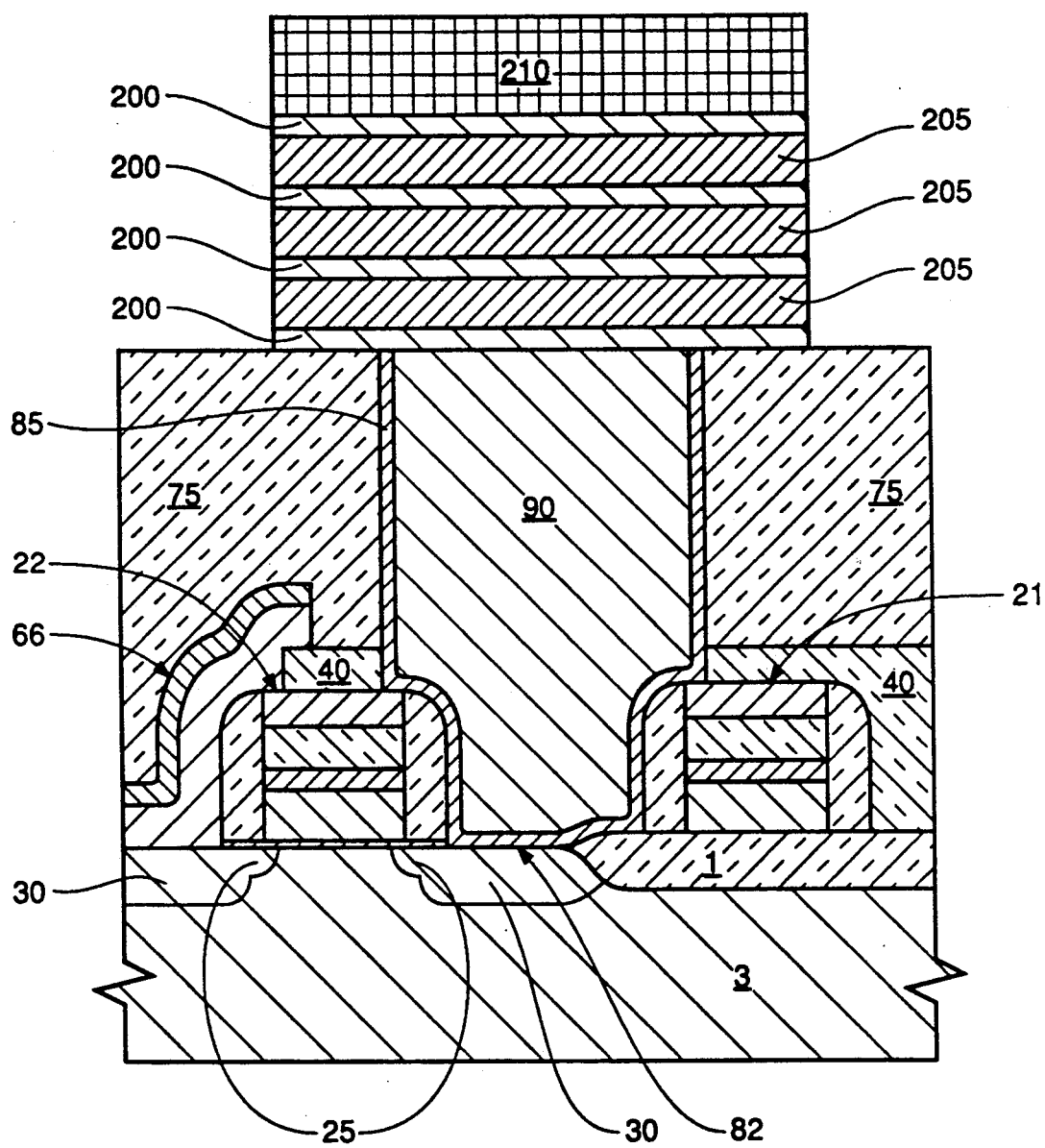
FIG. 16 is a cross-sectional view of the wafer portion of FIG. 15 following the masking and RIE etch of the alternating tungsten and TiN layers.

Referring to FIG. 16 the photoresist mask 210 defines an upper portion the second portion of the future storage node capacitor plate. The alternating layers of tungsten 200 and TiN 205 are isotropically etched.

Figure 17:
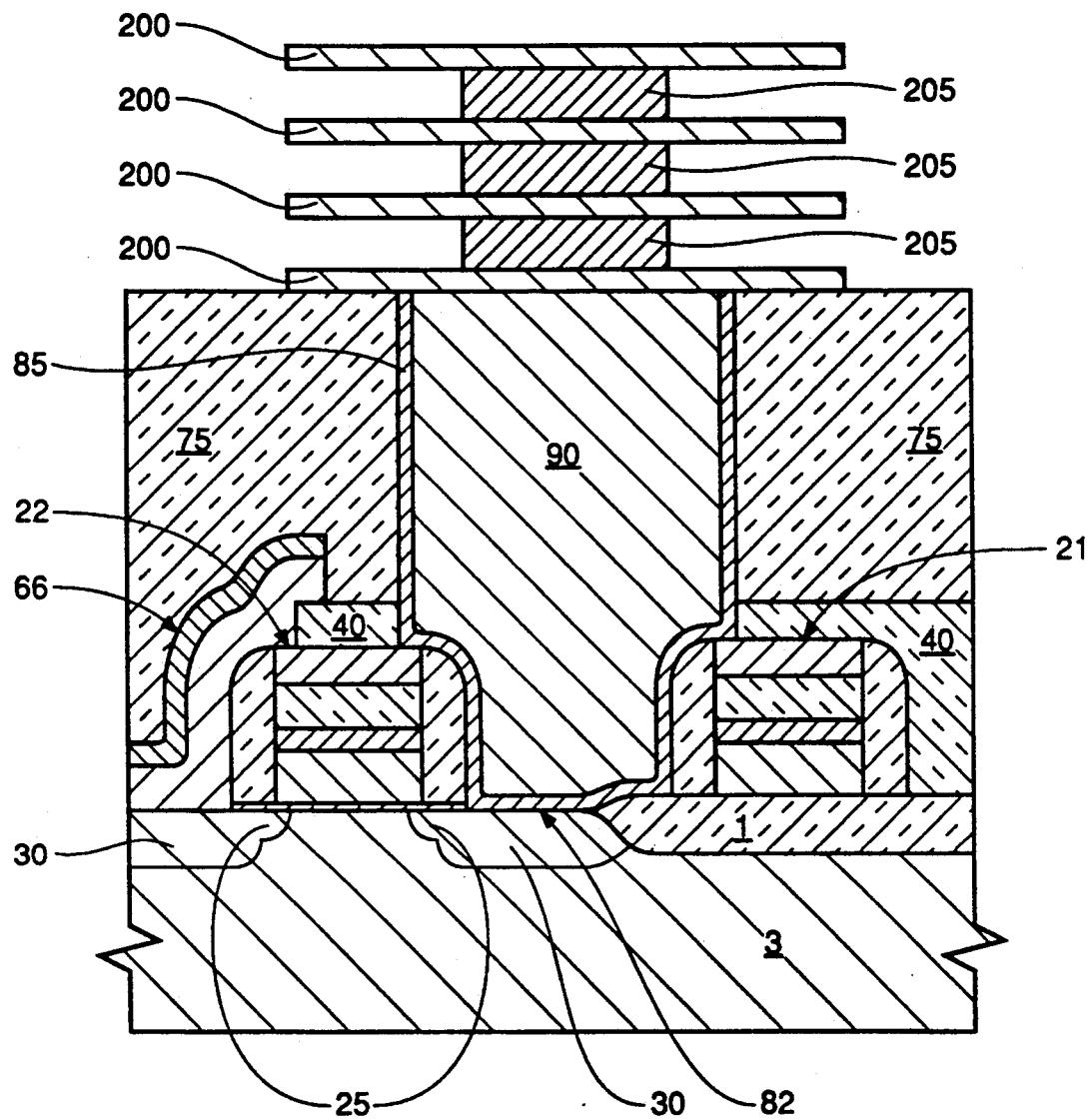
FIG. 17 is a cross-sectional view of the wafer portion of FIG. 16 following the removal of the photoresist shown in FIG. 16 and following a controllable isotropic etch of the TiN.

In FIG. 17 the alternating layers are shown following the removal of the photoresist mask 210 shown in FIG. 16 and following an isotropic etch of the TiN 205. The TiN 205 is controllably etched utilizing a piranha etch (either wet or vapor) such that a center portion of TiN 205 is retained after the etch. A piranha etch is an etch wherein the etch solution comprises a solution of hydrogen peroxide plus sulfuric acid. Any periphery contacts already fabricated must be protected by a mask during the piranha etch. The initial tungsten and TiN core 95 and the alternating layers of tungsten 200 and TiN 205 retained after the etch comprise the storage node capacitor plate.

Figure 18:
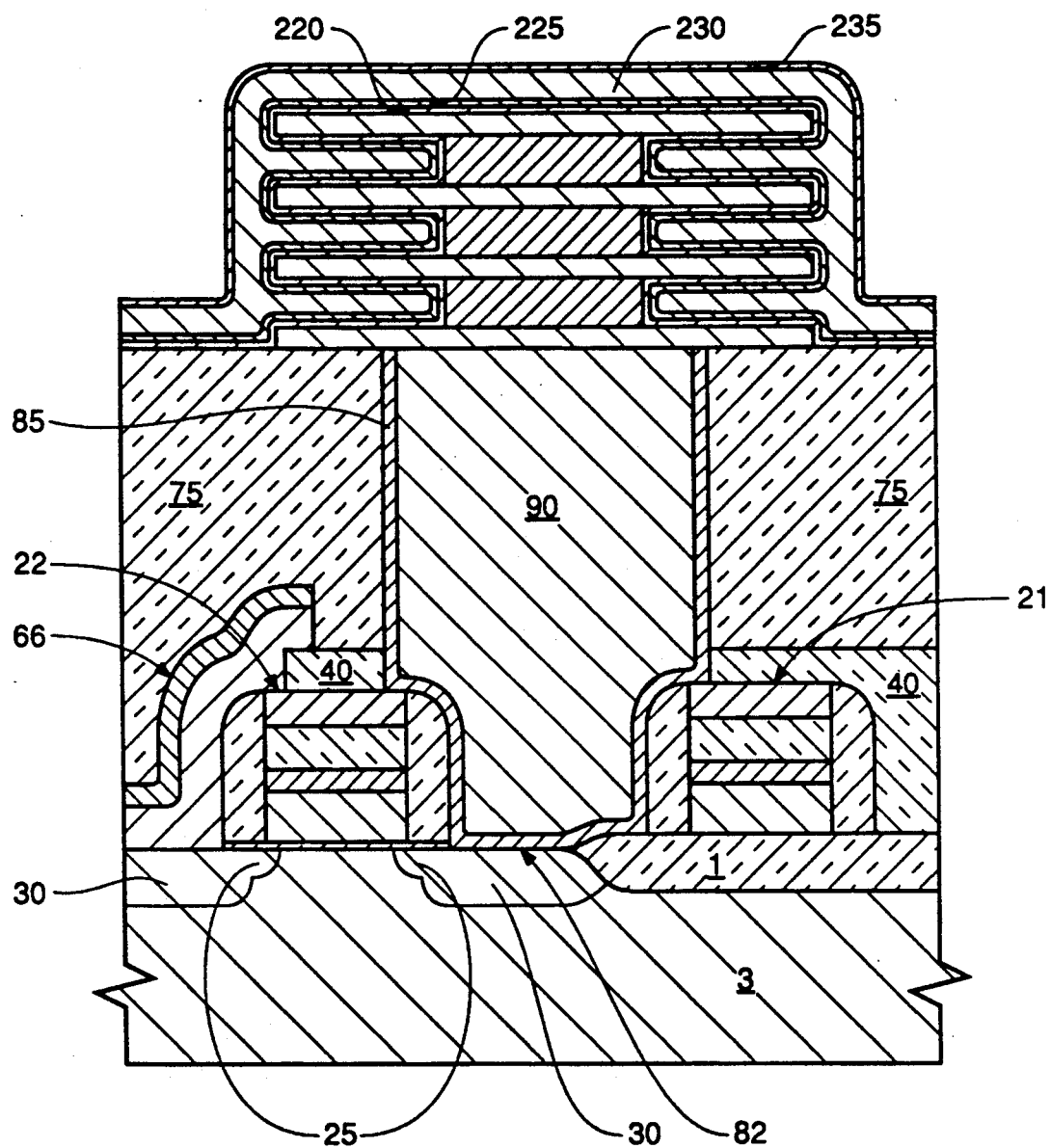
FIG. 18 is a cross-sectional view of the wafer portion of FIG. 17 following the deposition of a dielectric layer, a cell poly layer, and a nitride layer respectively.

In FIG. 18 a thin polysilicon layer 220 typically having a thickness of 50 Å is deposited to overlie all exposed surfaces. The polysilicon layer 220 provides a silicon surface for a subsequent dielectric deposition. A thin dielectric layer 225 comprising silicon nitride is blanket deposited to overlie the polysilicon 220. The dielectric layer typically has a thickness of 100 Å. An optional wet anneal may be performed subsequent to the silicon nitride deposition to oxidize the silicon in pinholes of the nitride. The wet anneal improves dielectric breakdown properties of the capacitor thus formed. A thick cell poly layer 230 is deposited to overlie the dielectric layer and completely fill the cavity remaining after the TiN etch and subsequent dielectric deposition. The thick cell poly layer 230 is subjected to an insitu phosphorous diffusion doped implant to decrease its resistivity. The cell plate comprises the cell poly layer. In order to protect the thick cell poly layer 230 during subsequent oxidization steps of the fabrication process, a thin layer of oxidation resistant silicon nitride 235 is blanket deposited to overlie the thick cell poly layer 230.

Figure 19:
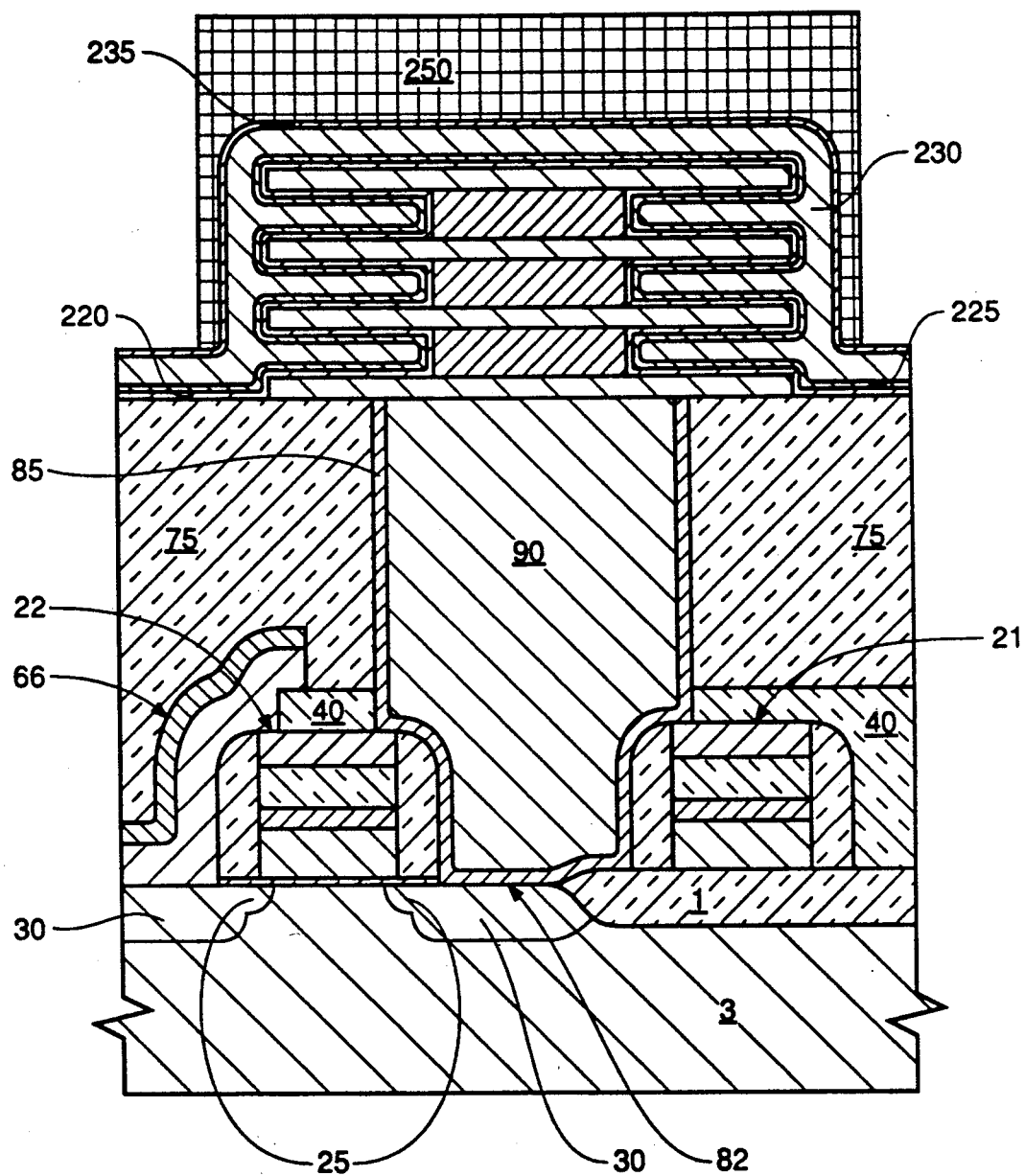
FIG. 19 is a cross-sectional view of the wafer portion of FIG. 18 following patterning of the storage capacitor with photoresist.

The storage capacitors are patterned with photoresist mask 250 as shown in FIG. 19.

Figure 20:
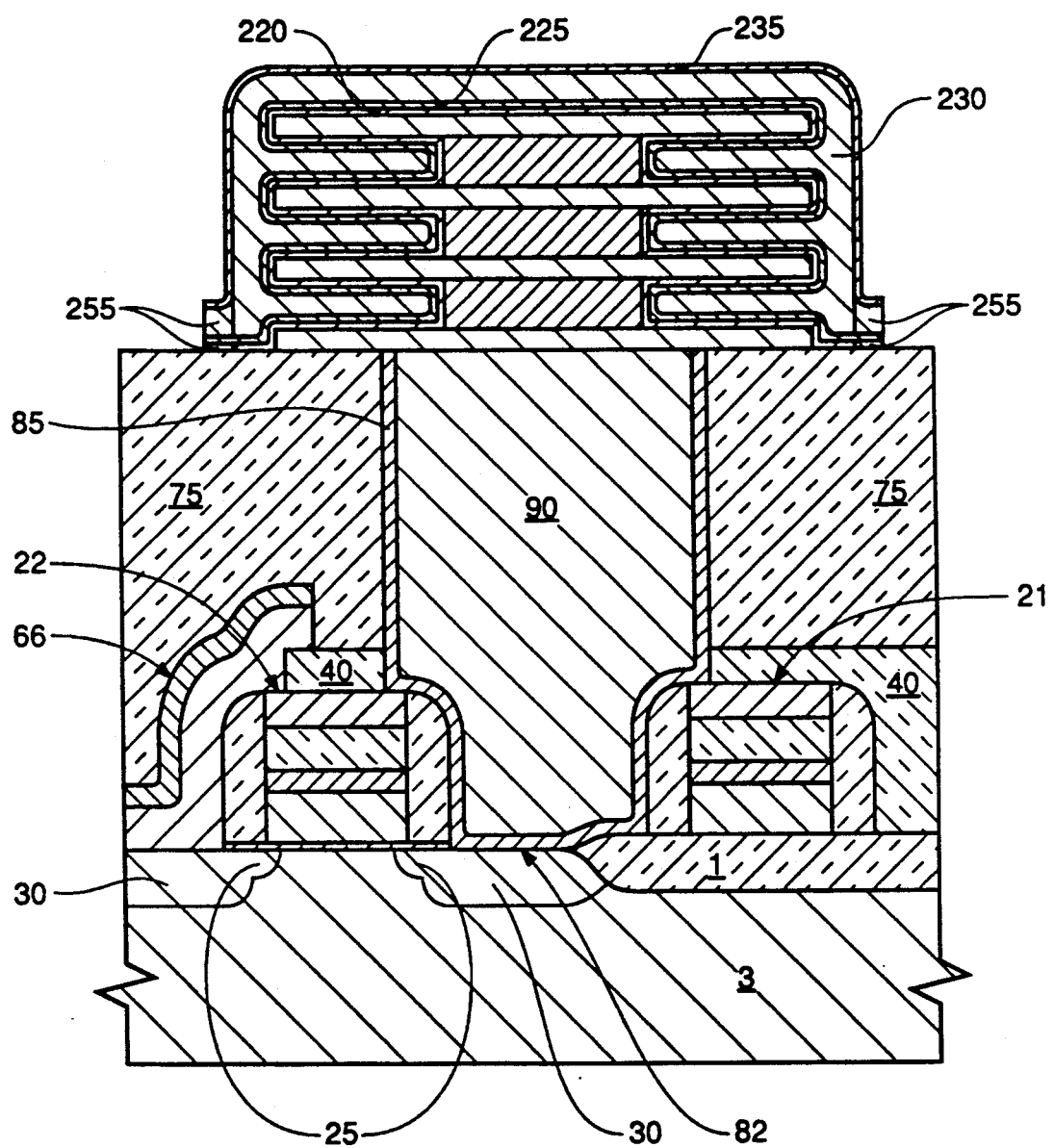
FIG. 20 is a cross-sectional view of the wafer portion of FIG. 19 following a RIE etch of the cell polysilicon, the dielectric layer, and the nitride layer; following the oxidation of the polysilicon exposed during the etch; and following the removal of the photoresist shown in FIG. 19.

In FIG. 20 the polysilicon layer 220, the dielectric layer 225, the cell poly layer 230, and the nitride layer 235 is RIE etched in the unmasked areas, and the photoresist mask 250 shown in FIG. 19 is removed.

Figure 21:
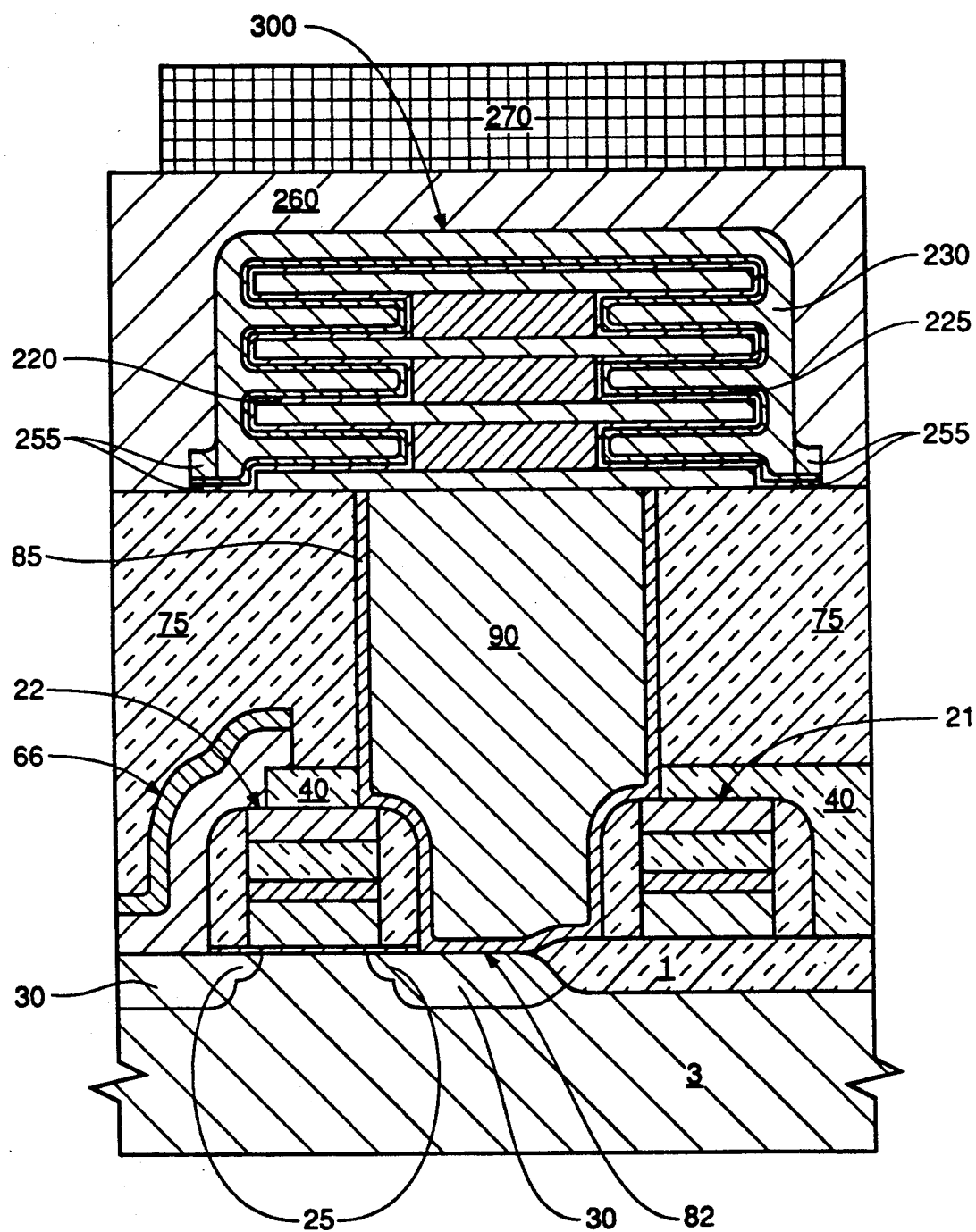
FIG. 21 is a cross sectional view of the wafer portion of FIG. 20 following an RIE etch of the top nitride layer, following the deposition of a conductive layer and following the noncritical patterning of the cell array.

In FIG. 21 the nitride layer 235 shown in FIG. 19 is RIE etched and layers of conductive material 260 is deposited to create a cell poly interconnect and eliminate a cell poly mask. Conductive material 260 functions as a cell poly interconnect and eliminates a cell polysilicon mask. The conductive material 260 preferably comprises a metal such as aluminum, Al/si/Cu, tungsten, or an aluminum/cooper alloy. This layer of conductive material 260 is typically used throughout the circuit periphery. In order to retain the conductive material overlying and in contact with portions of cell poly layer 220, the conductive material 260 is masked by photoresist 270 in a noncritical alignment pattern over the cell array in order to connect all the cell poly over the storage node. Since the cell poly is aligned with the storage node poly pattern, a cell poly masking step is eliminated.

Figure 22:
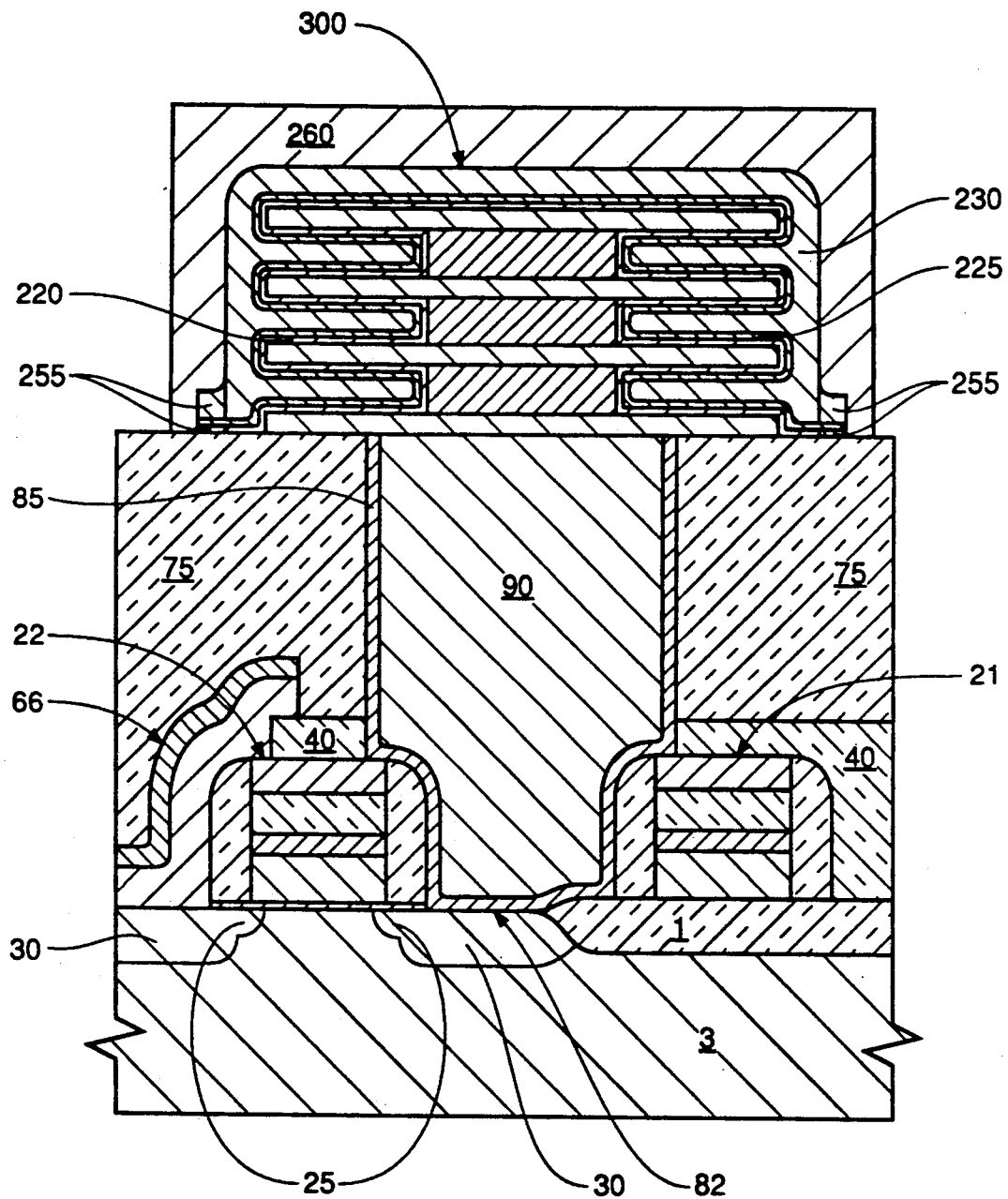
FIG. 22 is a cross sectional view of the wafer portion of FIG. 21 following an RIE metal etch of the conductive layer.

In FIG. 22 the unmasked conductive material 260 has been RIE metal etched, the photoresist 270 shown in FIG. 21 has been removed, and the fabrication of the storage capacitors 300 is complete. The storage node capacitor thus formed has a storage node capacitor plate comprising the Tungsten and TiN core 95 and an upper portion of elevationally stacked fingers comprising tungsten 200 and TiN 205. The cell plate of the storage nod capacitor comprises the cell poly 230.

The invention allows the vertical portion of a DRAM device to be utilized as the storage cell thus maximizing die space in the horizontal direction, and reducing the stack capacitor height prior to contacts. In the first embodiment the lower polysilicon layer extends the lower capacitor plate thus increasing capacitor area and capacitance. The RIE storage node polysilicon etch maximizes the cell size over the cell size attainable when utilizing a wet poly etch. The storage node contact and storage node polysilicon are self-aligned. A mask step is eliminated over previous methods since there is no cell poly mask.

In the second embodiment the elevationally stacked fingers increase capacitor area and thus capacitance. Of course the number of fingers fabricated is dependent on the number of alternating layers deposited with capacitance increasing as the number of fingers increases. The fingers are stacked vertically thus maximizing die space in the horizontal direction.

Thus the increase in capacitance is effected using minimal masking steps and minimal surface area of the DRAM device.

The process also facilitates the effective use of a buried digit line configuration. There are no digit line stringers, thus yield is increased.

Although as described the preferred embodiment is applicable to 4-megabit, 16-megabit, 64-megabit and 256-megabit DRAM cells, the process is not limited to these uses.

Although polycrystalline silicon is used in the capacitor fabrication of the preferred embodiments, amorphous and monocrystalline silicon may also be used.

Although two embodiments of the invention have been herein described, it will be apparent to one skilled in the art that changes and modifications may be made thereto without departing from the spirit and scope of the invention as claimed.

What is claimed is:

1. A method for forming a plurality of capacitors on a semiconductor substrate comprising:
   a) depositing an isolation interlayer to overlie at least said substrate;
   b) masking said interlayer with a contact photoresist pattern, said masking defining self-aligned regions in which to form said plurality of capacitors, said contact photoresist pattern also patterning periphery contacts;
   c) etching said interlayer to form first openings in said interlayer in order to expose contact areas of said substrate;
   d) removing said contact photoresist pattern;
   e) depositing a layer of diffusion barrier material to overlie said interlayer and said contact area, said depositing sufficient to effect minimal substrate damage;
   f) depositing a refractory metal to overlie said layer of diffusion barrier material and to fill said first opening;
   g) removing portions of said layer of diffusion barrier material and said refractory metal in order to expose said interlayer, said removing forming a plurality of cores, each of said plurality comprising said layer of diffusion barrier material and said refractory metal remaining after said removing;
   h) masking said interlayer with photoresist, said masking defining further etch regions adjacent to said plurality of said cores;
   i) etching said interlayer to expose an upper portion of a sidewall of each of said cores;
   j) removing said photoresist;
   k) depositing an electrically conductive layer to overlie said sidewalls, said cores, and said interlayer exposed during said etching;
   l) depositing a dielectric layer to overlie said electrically conductive layer;
   m) performing a wet anneal in order to oxidize said dielectric layer;

n) depositing a capacitive layer to overlie said dielectric layer; and o) individualizing each of said plurality of capacitors.

2. The method as specified in claim 1, wherein said individualizing further comprises:

a) depositing a protective layer to overlie said capacitive layer;

b) defining a plurality of capacitor regions with a capacitor region photoresist pattern, said capacitor region photoresist pattern protecting said capacitor regions during a subsequent etch;

c) etching said protective layer, said capacitive layer, said dielectric layer and said electrically conductive layer, said etching forming said plurality of capacitors by defining a storage node portion of each of the plurality of capacitors, each of said storage node portions comprising one of said cores and a corresponding said electrically conductive layer adjacent to said core, said capacitive layer forming a cell capacitor plate for each of said storage node portions, and said capacitive layer and said electrically conductive layer having exposed sides;

d) removing said capacitor region photoresist pattern;

e) oxidizing said exposed sides, said oxidizing electrically insulating said exposed sides, said protective layer protecting a top portion of said capacitive layer from oxidizing; and f) removing said protective layer.

3. The method as specified in claim 1, wherein said individualizing further comprises:

a) depositing an interconnect material to overlie and be in electrical communication with said capacitive layer;

b) defining interconnect lines with an interconnect photoresist pattern, said interconnect lines for providing electrical communication to and from said capacitors of said plurality;

c) etching said interconnect material to form said interconnect lines; and d) removing said interconnect photoresist pattern.

4. A method for forming at least one capacitor on a semiconductor substrate comprising:

a) forming a dielectric isolation interlayer to overlie at least said substrate;

b) etching a first opening in said interlayer in order to expose a contact area of said substrate;

c) depositing a layer of barrier material to overlie said interlayer and said contact area;

d) depositing a refractory metal to overlie said barrier material and to fill said first opening:

e) removing a top portion of said refractory metal and a top portion of said barrier material to expose said interlayer and to form a first portion of a storage node capacitor plate comprising said refractory metal and said barrier material retained subsequent to said removing;

f) creating a second opening adjacent to said first portion of said storage node capacitor plate in said interlayer;

g) depositing an electrically conductive material in said second opening overlying said first portion, said electrically conductive material forming a second portion of said storage node capacitor plate;

h) depositing a dielectric layer to overlie said storage node capacitor plate; and i) depositing a capacitive layer to overlie said dielectric layer, said capacitive layer forming a cell capacitor plate, said dielectric layer capable of insulating said capacitive layer from said storage node capacitor plate.

5. The method as specified in claim 4, further comprising:

a) planarizing said interlayer prior to said etching of said first opening;

b) defining said first opening in said interlayer with a contact photoresist pattern prior to said etching of said first opening in said interlayer, said contact photoresist pattern also patterning periphery contacts;

c) removing said contact photoresist pattern subsequent to said etching of said first opening; and d) protecting said periphery contacts during said etching of said diffusion barrier material.

6. The method as specified in claim 4, further comprising performing an anneal subsequent to said depositing said dielectric layer.

7. The method as specified in claim 4, wherein said forming said interlayer further comprises depositing a first oxide layer and depositing a second oxide layer to overlie said first oxide layer.

8. The method as specified in claim 7, further comprising doping said second oxide layer.

9. The method as specified in claim 8, wherein said second oxide layer comprises a thick doped borophosphosilicate glass.

10. The method as specified in claim 4, further comprising:

a) masking said electrically conductive material to define said second portion of said storage node capacitor plate; and b) etching unmasked portions of said electrically conductive material to form said second portion of said storage node capacitor plate.

11. The method as specified in claim 4, wherein said depositing said electrically conductive material further comprises depositing polysilicon.

12. The method as specified in claim 11, further comprising doping said electrically conductive material to increase conductivity.

13. The method as specified in claim 4, wherein creating said second opening adjacent to said first portion further comprises:

a) masking said interlayer with photoresist, said masking defining regions adjacent to and overlying said first portion; and b) etching said interlayer adjacent to and overlying said first portion in order to expose sidewalls of a upper portion of said first portion.

14. The method as specified in claim 4, further comprising depositing a sufficient quantity of barrier material to effect minimal substrate damage during said depositing said refractory metal, said barrier material minimizing diode leakage, and said barrier material having a low contact resistance with said contact area.

15. The method as specified in claim 4, wherein said removing said top portion comprises planarizing said barrier material and said refractory metal.

16. The method as specified in claim 4, further comprising doping said capacitive layer to reduce resistivity of said capacitive layer.

17. The method as specified in claim 4, wherein said depositing said electrically conductive material further comprises filling said second opening in said interlayer with said electrically conductive material.

* * * * *